(12) United States Patent
Nishizawa et al.

(10) Patent No.: US 7,971,793 B2
(45) Date of Patent: Jul. 5, 2011

(54) MEMORY CARD

(75) Inventors: Hirotaka Nishizawa, Fuchu (JP); Akira Higuchi, Kodaira (JP); Kenji Osawa, Hachioji (JP); Tamaki Wada, Higashimurayama (JP); Michiaki Sugiyama, Tokyo (JP); Junichiro Osako, Kodaira (JP)

(73) Assignee: Renesas Electronics Corporation, Kawasaki-shi (JP)

(*) Notice: Subject to any disclaimer, the term of this patent is extended or adjusted under 35 U.S.C. 154(b) by 0 days.

(21) Appl. No.: 11/945,745

(22) Filed: Nov. 27, 2007

(65) Prior Publication Data

US 2008/0073436 A1 Mar. 27, 2008

Related U.S. Application Data

(63) Continuation of application No. 10/912,289, filed on Aug. 6, 2004, now Pat. No. 7,308,588.

(30) Foreign Application Priority Data

Sep. 8, 2003 (JP) ................................. 2003-316002

(51) Int. Cl.
*G06K 19/06* (2006.01)
(52) U.S. Cl. ............ 235/492; 902/26; 257/679; 361/737
(58) Field of Classification Search ................. 902/26; 257/679; 361/737
See application file for complete search history.

(56) References Cited

U.S. PATENT DOCUMENTS

| 4,785,166 A | 11/1988 | Kushima |
| 5,530,673 A | 6/1996 | Tobita et al. |
| 5,758,121 A | 5/1998 | Fukuzumi |
| 6,045,043 A * | 4/2000 | Bashan et al. ................. 235/492 |
| 6,168,083 B1 * | 1/2001 | Berger et al. .................. 235/492 |
| 6,292,858 B1 | 9/2001 | Inkinen et al. |
| 6,389,542 B1 | 5/2002 | Flyntz |
| 6,474,558 B1 * | 11/2002 | Reiner ........................... 235/492 |
| 6,560,082 B1 * | 5/2003 | Arisawa .......................... 361/84 |
| 6,585,166 B1 * | 7/2003 | Ookawa et al. ................. 235/492 |

(Continued)

FOREIGN PATENT DOCUMENTS

EP 1 083 517 A2 * 3/2001

(Continued)

OTHER PUBLICATIONS

"The Multimedia Card", MMCA Technical Committee, Version 3.3, Mar. 2003, pp. 1-150.

*Primary Examiner* — Michael G Lee
*Assistant Examiner* — Kristy A Haupt
(74) *Attorney, Agent, or Firm* — Miles & Stockbridge P.C.

(57) ABSTRACT

The present invention provides a memory card equipped with an interface controller connected to external connecting terminals, a memory connected to the interface controller, and a security controller connected to the interface controller. A second external connecting terminal capable of supplying an operating power supply to the security controller is provided aside from a first external connecting terminal which supplies an operating power supply to the interface controller and the memory. An interface unit of the interface controller connected to the security controller receives the operating power supply from the second external connecting terminal and thereby enables a stop of the supply of the operating power supply from the first external connecting terminal. Even if the supply of the operating power supply to the interface controller is cut off, the output of the interface unit is not brought to an indefinite state.

12 Claims, 20 Drawing Sheets

U.S. PATENT DOCUMENTS

| | | |
|---|---|---|
| 6,669,487 B1 | 12/2003 | Nishizawa et al. |
| 6,963,765 B2 | 11/2005 | Hattori et al. |
| 7,237,719 B2 * | 7/2007 | Fruhauf .................... 235/492 |
| 2001/0006902 A1 * | 7/2001 | Ito ............................. 455/558 |
| 2002/0170974 A1 * | 11/2002 | Kashima ................. 235/492 |
| 2005/0212690 A1 * | 9/2005 | Nishikawa ............. 340/932.2 |

FOREIGN PATENT DOCUMENTS

| | | |
|---|---|---|
| EP | 1 191 491 A2 | 3/2002 |
| EP | 1 278 154 A1 | 1/2003 |
| EP | 1 396 815 A1 | 3/2004 |
| JP | 2000-322544 A * | 11/2000 |
| TW | 403871 | 9/2000 |
| WO | WO 01/01340 A1 * | 1/2001 |
| WO | WO 01/84490 A1 | 11/2001 |
| WO | WO 02/099742 A1 | 12/2002 |

* cited by examiner

FIG. 3

| TERMINAL NUMBER | 1bit MODE | | 4bit MODE | | 8bit MODE | |
|---|---|---|---|---|---|---|
| | AT DUAL IC CARD FUNCTION | AT ONLY NON-CONTACT CARD FUNCTION | AT DUAL IC CARD FUNCTION | AT ONLY NON-CONTACT CARD FUNCTION | AT DUAL IC CARD FUNCTION | AT ONLY NON-CONTACT CARD FUNCTION |
| C1 | RSV (for MMC) CS (for SPI) | RSV (for MMC) CS (for SPI) | DAT3 | DAT3 | DAT3 | DAT3 |
| C2 | CMD | CMD | CMD | CMD | CMD | CMD |
| C3 | Vss1 | Vss1 | Vss1 | Vss1 | Vss1 | Vss1 |
| C4 | Vdd | Vdd | Vdd | Vdd | Vdd | Vdd |
| C5 | CLK | CLK | CLK | CLK | CLK | CLK |
| C6 | Vss2 | Vss2 | Vss2 | Vss2 | Vss2 | Vss2 |
| C7 | DAT | DAT | DAT0 | DAT0 | DAT0 | DAT0 |
| C8 | RSV | RSV | DAT1 | DAT1 | DAT1 | DAR1 |
| C9 | RSV | RSV | DAT2 | DAT2 | DAT2 | DAT2 |
| C10 | RES-ic | RSV | RES-ic | RSV | DAT4 | DAT4 |
| C11 | CLK-ic | RSV | CLK-ic | RSV | DAT5 | DAT5 |
| C12 | Vcc-ic | RSV | Vcc-ic | RSV | DAT6 | DAT6 |
| C13 | I/O-ic | RSV/Vcc-ic | I/O-ic | RSV/Vcc-ic | DAT7 | DAT7 |
| C14 | LA | LA | LA | LA | LA | LA |
| C15 | Vcc-IC | (Vcc-IC) | Vcc-IC | (Vcc-IC) | Vcc-IC | (Vcc-IC) |
| C16 | LB | LB | LB | LB | LB | LB |

MEMORY CARD

CROSS-REFERENCE TO RELATED APPLICATION

This application is a continuation of application Ser. No. 10/912,289 filed Aug. 6, 2004, now U.S. Pat. No. 7,308,588.

The present application claims priority from Japanese patent applications JP 2003-316002 filed on Sep. 8, 2003, and JP 2004-80593 filed on Mar. 19, 2003, the contents of which are hereby incorporated by reference into this application.

BACKGROUND OF THE INVENTION

The present invention relates to a memory card equipped with a security controller together with an interface controller and a memory.

A patent document 1 (International Patent Publication WO01/84490, Pamphlet (U.S. Pat. No. 6,669,487)) has described a technique wherein in order to realize a multibank or a multifunction while maintaining compatibility with MMC (Multi Media Card: Registered Trade Mark) standards, a memory card based on the MMC standards is equipped with an SIM (Subscriber Identity Module) to thereby enhance security.

A patent document 2 (International Patent Publication WO02/099742, Pamphlet (U.S. application Ser. No. 10/476,223, now U.S. Pat. No. 7,185,145)) has described a memory device in which a flash memory chip, an IC card chip which executes security processing, and a controller chip which controls them in accordance with instructions issued from outside, have been packaged.

Further, a non-patent document 1 (The MultiMedia Card System Specification Version 3.3) has described standards for a multimedia card.

SUMMARY OF THE INVENTION

The present inventors have discussed a memory card equipped with a security controller like an IC card microcomputer together with an interface controller and a memory to realize a multifunction.

Firstly, it has been revealed that a disadvantage occurs in such an operation form that where the supply of an operating power supply voltage for the interface controller and the memory, supplied from outside, to the interface controller and the memory is stopped when the interface controller and the security controller are connected, and the operating power supply voltage can be supplied only to the security controller, the operating power supply is applied only to the security controller to allow it to exclusively execute security processing. That is, when no operating power supply is applied to the interface controller, an output control state of an output buffer becomes indefinite at an interface unit of the interface controller connected to the security controller, so that such a case that the interface unit is being brought to a low impedance state, takes place. It has been found out that when a clock or signal for power-on reset or startup of the security controller is supplied from outside in such a state, the clock or signal flows into the interface unit being held in the low impedance state, thus resulting in innegligible noise or causing a fear of the occurrence of a malfunction. There is fear that communication sensitivity is significantly degraded particularly when the security controller or the like interfaces with the outside in a non-contact form.

Secondly, the present inventors have fount out the importance that when the security controller has a non-contact interface function, a layout relationship with other connecting terminals for signals or a clock or the like should be taken into consideration where a card's wiring board is provided with external antenna connecting terminals for an increase in communication sensitivity. That is, when routing of wirings extending to connecting terminals for signals and a clock or the like and routing of wirings extending to the external antenna connecting terminals are complexified and thereby often adjoin each other and stride over the wiring board, noise is carried or superimposed on the signal lines or wirings and clock wiring due to crosstalk and induction or the like. Alternatively, the noise produced due to the crosstalk and induction or the like from the signal lines and clock wiring is carried on a high-frequency signal received from an external high-frequency antenna, so that an error occurs in input/output data at a non-contact operation. The external antenna connecting terminals need to adopt such a layout that the occurrence of such noise can be suppressed as low as practicable. Further, when the supply of the operating power supply voltage for the interface controller and memory is stopped and the operating power supply voltage can be supplied to the security controller, the layout of external connecting terminals each supplying a high level of operating power supply also needs consideration similar to above where the level of the operating power supply voltage of the security controller is higher than the level of the operating power supply voltage of the interface controller.

An object of the present invention is to suppress the occurrence of noise in a memory card equipped with a security controller together with an interface controller and a memory to realize a multifunction.

Another object of the present invention is to suppress the occurrence of noise in such an operation form that an operating power supply is applied to a security controller alone to execute security processing in a memory card equipped with the security controller together with an interface controller and a memory to realize a multifunction.

Further, the operating power supplies for the interface controller and security controller are separated from each other to reduce power consumption of the whole memory card.

A further object of the present invention is to prevent the layout of connecting terminals for connecting an external antenna to a security controller having a non-contact interface function from promoting the occurrence of noise in a relationship with other connecting terminals in a memory card equipped with the security controller together with an interface controller and a memory to realize a multifunction.

The above, other objects and novel features of the present invention will become apparent from the description of the Specification and the accompanying drawings.

Summaries of representative ones of the inventions disclosed in the present application will be explained in brief as follows:

[1] A memory card according to the present invention comprises an interface controller (7) connected to a plurality of external connecting terminals; a memory (8) connected to the interface controller; a security controller (9) connected to the interface controller, the interface controller, the memory and the security controller being mounted over a wiring board formed with the plurality of external connecting terminals; a first external connecting terminal (C4) which supplies an operating power supply to the interface controller and the memory; and a second external connecting terminal (C15) capable of supplying an operating power supply to the security controller, which is provided aside from the first external connecting terminal, wherein an interface unit of the interface controller connected to the security controller receives the operating power supply from the second external connecting terminal and thereby enables a stop of the supply of the operating power supply from the first external connecting terminal.

Even when the supply of the operating power supply to the interface controller is cut off, the operating power supply to the security controller is supplied to the interface unit (11). Therefore, the output of the interface unit is not brought to an indefinite state. It is thus possible to suppress noise produced with an indefinite current flowing therein. In order to perfectly prevent a needless current from flowing into the interface unit, the interface unit may be controlled to a high impedance state in a state in which the supply of the operating power supply from the first external connecting terminal has been stopped.

In a specific form of the present invention, the interface unit has a level shift function which performs a level shift between a signal level based on a first power supply voltage supplied to the first external connecting terminal and a signal level based on a second power supply voltage supplied to the second external connecting terminal.

In another specific form of the present invention, there are provided, as interface terminals of the security controller, a third external connecting terminal (C11) which inputs a clock signal, a fourth external connecting terminal (C13) for the input/output of data, and a fifth external connecting terminal (C10) for the input of a reset signal. At this time, the third through fifth external connecting terminals are available to the interface controller as external connecting terminals for input/output signals according to card modes recognized by the interface controller. They can cope with several card modes different in the number of parallel data input/output bits, for example. When the interface controller makes use of the third through fifth external connecting terminals as the external connecting terminals for the data input/output, the security controller is capable of making an interface with the outside via the interface controller. At this time, when the third through fifth external connecting terminals are disconnected from the interface controller by a separation switch circuit (12), it is possible to suppress the undesired output of signals transferred between an external circuit connected to the third through fifth external connecting terminals and the interface controller in accordance with the interface function of the security controller, to the outside.

As a further specific form of the present invention, the security controller may be both or any one of an IC card microcomputer capable of performing a non-contact interface with the outside and an IC card microcomputer capable of performing a contact interface with the outside. The security controller may be an IC card microcomputer capable of performing both a non-contact interface and a contact interface with the outside.

As yet another specific form of the present invention, when the security controller has antenna connecting terminals (C14, C16) which enable a high-frequency antenna for a non-contact interface to be connected as the external connecting terminals when the security controller is an IC card microcomputer capable of performing a non-contact interface with the outside, the antenna connecting terminals may preferably be disposed in the neighborhood of the first external connecting terminal, adjacent to the second external connecting terminal. Such antenna connecting terminals are used to connect the external high-frequency antenna for increasing the sensitivity of the non-contact interface. The voltage applied between the antenna connecting terminals is relatively high and high in frequency too. Thus, when routing of wirings extending to connecting terminals for signals and a clock or the like and routing of wirings extending to the external antenna connecting terminals are complexified and thereby often adjoin each other and stride over the wiring board, noise is carried or superimposed on the signal lines or wirings and clock wiring due to crosstalk and induction or the like. Alternatively, the noise produced due to the crosstalk and induction or the like from the signal lines and clock wiring is carried on a high-frequency signal received from the external high-frequency antenna, so that an error occurs in input/output data at a non-contact operation. Since the antenna connecting terminals are disposed in the vicinity of the first external connecting terminal, adjacent to the second external connecting terminal, their arrangements result in layouts suitable for suppressing the occurrence of noise to the utmost.

The plurality of external connecting terminals have zigzag layouts in which column directional arrangements are shifted among columns adjacent to one another in the vicinity of the direction to insert a memory card. Owing to the zigzag layouts, a card slot in which the memory card is detachably mounted, is capable of coping with multi-terminating by a relatively simple configuration that a lot of slot terminals thereof are alternately laid out in parallel while their amounts of protrusion are being changed. For example, the second through fifth external connecting terminals and the antenna connecting terminals are provided in arrangements on the rear side, which are adjacent to one another in the vicinity of the direction to insert the memory card. In particular, the second external connecting terminal and the antenna connecting terminals may be placed in a central portion of the column directional arrangement. The second external connecting terminal may be set to a layout zigzag with respect to the antenna connecting terminals.

As a still further specific form of the present invention, it is preferable to, when the interface controller, the memory and the security controller are of individual semiconductor chips respectively, laminate the semiconductor chip constituting the interface controller over the semiconductor chip constituting the memory, and wire-bond electrodes of the wiring board onto electrode pads disposed along the same directional sides of their semiconductor chips respectively. Thus, bonding wires can be shortened and interference of each wire is also lessened.

[2] A memory card according to the present invention comprises an interface controller connected to a plurality of external connecting terminals; a memory connected to the interface controller; a security controller, the interface controller, the memory and the security controller being mounted over a wiring board formed with the plurality of external connecting terminals; a first external connecting terminal which supplies an operating power supply to the interface controller and the memory; and a second external connecting terminal capable of supplying an operating power supply to the security controller, which is provided aside from the first external connecting terminal, wherein the security controller is an IC card microcomputer capable of performing a non-contact interface with the outside and includes antenna connecting terminals which enable an antenna for a non-contact interface to be connected, as the external connecting terminals, and the antenna connecting terminals are disposed in the neighborhood of the first external connecting terminal, adjacent to the second external connecting terminal.

The plurality of external connecting terminals have zigzag layouts in which column directional arrangements are shifted among columns adjacent to one another in the vicinity of the direction to insert a memory card. Owing to the zigzag layouts, a card slot is capable of coping with multi-terminating by a relatively simple configuration that a lot of slot terminals thereof are alternately laid out in parallel while their amounts of protrusion are being changed. For example, the second through fifth external connecting terminals and the antenna connecting terminals are provided in arrangements on the rear side, which are adjacent to one another in the vicinity of the direction to insert the memory card. In particular, the second external connecting terminal and the antenna connecting terminals may be placed in a central portion of the column directional arrangement. The second external connecting terminal may be set to a layout zigzag with respect to the antenna connecting terminals.

Advantageous effects obtained by representative ones of the inventions disclosed in the present application will be explained in brief as follows:

A memory card equipped with a security controller together with an interface controller and a memory to realize a multifunction is capable of suppressing the occurrence of noise in such an operation form that an operating power supply is applied to only the security controller to execute security processing.

A memory card equipped with a security controller together with an interface controller and a memory to realize a multifunction is capable of preventing the layout of connecting terminals for connecting an external antenna to the security controller having a non-contact interface function from promoting the occurrence of noise in a relationship with other connecting terminals.

It is possible to suppress the occurrence of noise in a memory card equipped with a security controller together with an interface controller and a memory to realize a multi-function.

BRIEF DESCRIPTION OF THE DRAWINGS

FIG. 3 is an explanatory view illustrating functional allocations of external connecting terminals corresponding to card modes of the memory card;

DETAILED DESCRIPTION OF THE PREFERRED EMBODIMENTS

Communication Portable Terminal

Figure 2:
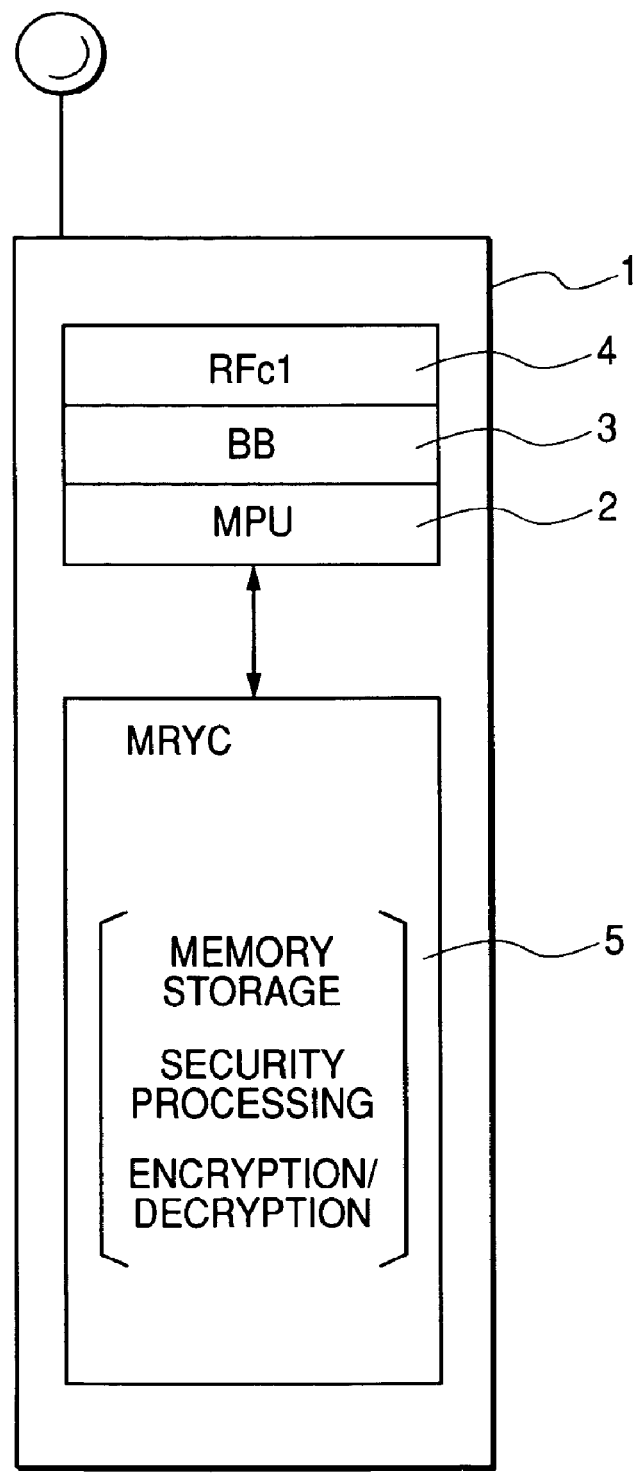
FIG. 2 is an explanatory view schematically depicting a communication portable terminal such as a cellular phone to which the memory card according to the present invention is applied.

A communication portable terminal such as a cellular phone to which a memory card according to one embodiment of the present invention is applied, is schematically shown in FIG. 2. The communication portable terminal 1 includes a microprocessor (MPU) 2 which controls the whole system, for example, a baseband processor (BB) 3 which performs baseband processing such as modulation and demodulation for mobile communications, a high-frequency unit (RFc1) 4 which performs transmission/reception by a prescribed high frequency, and a memory card (MRYC) 5. The MRYC 5 is detachably mounted in an unillustrated card slot of the communication portable terminal 1. The MPU 2 is positioned to the MRYC 5 as a card host.

The MRYC 5 provides a multifunction such as a memory storage function, a high-level security processing function for E-commerce or the like, a low-level security processing function for accounting or the like at a transit system, a content data encrypt/decrypt processing function, etc.

<<MRYC with IC Card Microcomputer Built Therein>>

Figure 1:
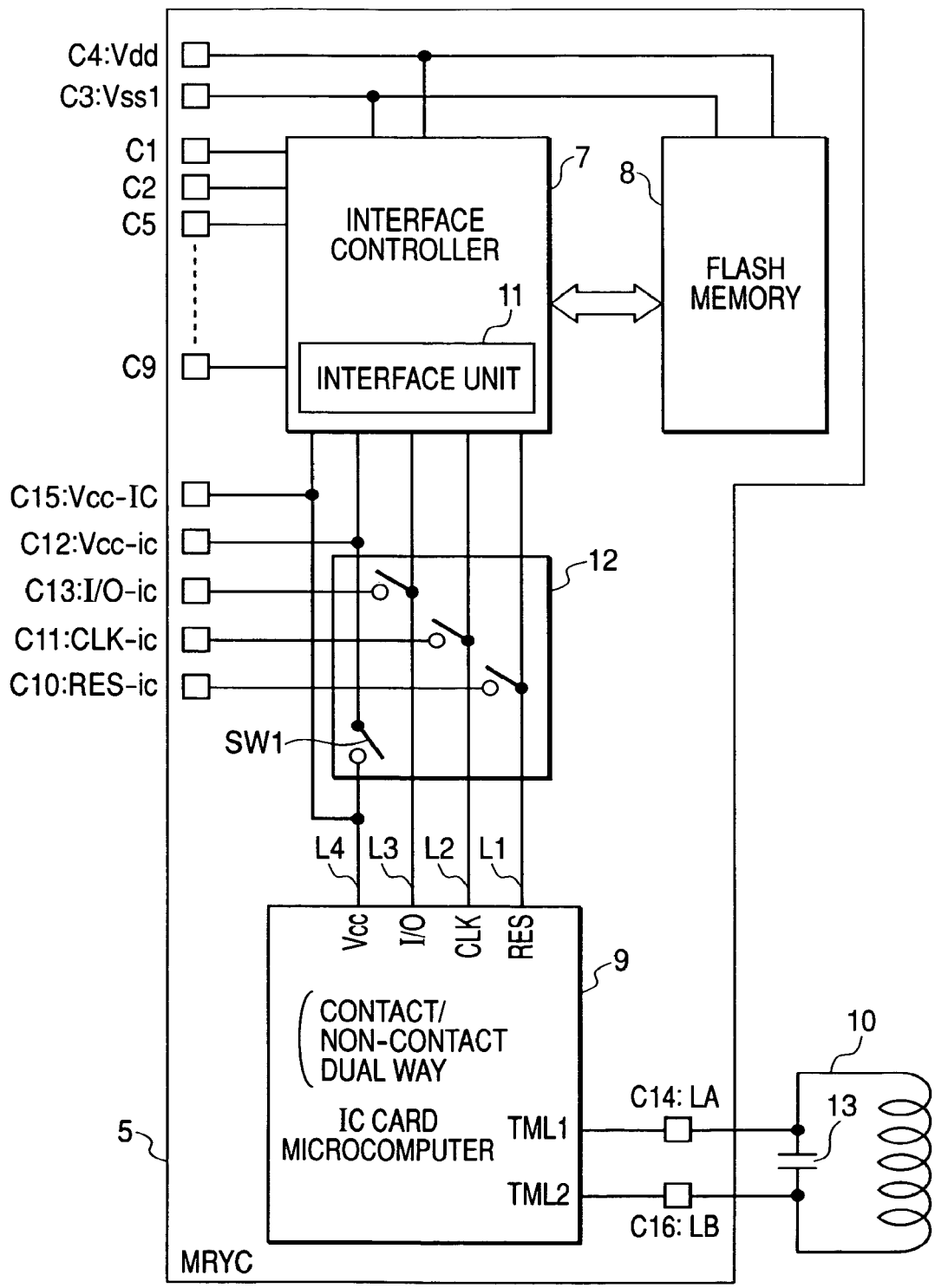
FIG. 1 is a block diagram showing one example of a memory card according to the present invention.

A configuration of the MRYC 5 is illustrated in FIG. 1. The MRYC 5 includes an interface controller 7, a flash memory 8 connected to the interface controller 7, and an IC (Integrated Circuit) card microcomputer (called also "IC card micon") 9 used as a security controller connected to the interface controller 7, all of which are mounted in a wiring board formed with a plurality of external connecting terminals C1 through C16. The interface controller 7, flash memory 8 and IC card microcomputer 9 are respectively constituted of individual semiconductor integrated circuit chips.

The interface controller 7 has an external interface function which serves as the memory card, a memory interface function corresponding to specs of the flash memory, and an IC card microcomputer interface function which interfaces with the IC card microcomputer by a memory card command. Now, the MRYC 5 satisfies external interface specs as a memory card based on the multimedia card standards.

The flash memory 8 is an electrically erasable and programmable non-volatile memory. Although not illustrated in the drawing in particular, the flash memory 8 has at least one electrically erasable and programmable non-volatile memory cell transistor (also written as "flash memory cell"). Although not illustrated in the drawing in particular, the flash memory cell has a so-called stacked gate structure having a floating gate, or a so-called split gate structure comprising a memory transistor section provided with an ONO (Oxide.Nitride.Oxide) gate insulating film and a select transistor section. The flash memory cell has a threshold voltage which rises when electrons are injected into the floating gate or the like, and a threshold voltage which drops when the electrons are pulled out of the floating gate or the like. The flash memory cell stores therein information corresponding to the vertical level of a threshold voltage with respect to a word line voltage for reading of data. Although not restricted in particular, a state in which the threshold voltage of each memory cell transistor is low, and a state in which the threshold voltage thereof is high, are respectively called "erase state" and "write state".

Although not shown in the drawing in particular, the IC card micron 9 includes a CPU and a non-volatile memory that holds its operation program and control information or the like used in authentication and performs authenticating processing in accordance with the operation program. Here, the IC card microcomputer 9 serves as a contact/non-contact dual-way IC card capable of performing a contact interface and a non-contact interface to the outside. The contact interface is carried out via serial communications using a 1-bit data input/output terminal I/O, a clock terminal CLK and a reset terminal RES. The non-contact interface is carried out via high-frequency communications using an antenna connected to terminals TML1 and TML2. An external antenna 10 and a tuning capacitor 13 are typically shown in the drawing. Although not shown in the drawing in particular, the non-contact interface may include a configuration wherein an internal antenna connected to the terminals TML1 and TML2 is provided inside a package of the MRYC 5 or over a circuit board thereof and configured separably by a switch when the external antenna 10 is connected to the terminals C14 and C16.

The functions and layout of the external connecting terminals C1 through C7 of the external connecting terminals C1 through C16 are based on the MMC standards, whereas the external connecting terminals C8 through C13 correspond to multi-bit data buses. The external connecting terminals C14 through C16 are newly provided.

Functional allocations of the external connecting terminals C1 through C16 corresponding to card modes of the MRYC 5 are shown in FIG. 3. A 1-bit mode, a 4-bit mode and an 8-bit mode mean the number of data input/output bits with respect to the outside of the MRYC 5. The term "only a non-contact card function" means a case in which an IC card microcomputer having only a non-contact interface function as an external interface function is mounted. This example will be explained in detail later. In the drawing, RSV (for MMC) denotes a reserve terminal in an MMC mode, CS (for SPI) denotes a chip select terminal in an SPI mode, CMD denotes a command terminal, Vss1 and Vss2 denote circuit's ground terminals, Vdd denotes a power supply terminal, CLK denotes a clock terminal of the memory card, DAT denotes a serial data input/output terminal, RES-ic denotes a reset terminal of the IC card microcomputer, CLK-ic denotes a clock terminal of the IC card microcomputer, Vcc-ic denotes a power supply terminal of the IC card microcomputer, LA and LB denote antenna connecting terminals, Vcc-IC denotes a dedicated power supply terminal for the IC card microcomputer, and DAT0 through DAT7 denote parallel data input/output terminals, respectively.

As is apparent from FIG. 3, basically, the external connecting terminals C1 through C9 are allocated to the memory card interface function, and the external connecting terminals C10 through C16 are allocated to the IC card interface function. However, the external connecting terminals C10 through C13 are allocated to the IC card interface function in the 1-bit and 4-bit modes, whereas in the 8-bit mode, they are allocated to the memory card interface function as the parallel data input/output terminals of the DAT4 through DAT7. The differences in the functional allocations of the terminals C10 through C13 appear as wirings L1 through L4 for connecting the interface controller 7 and the IC card microcomputer 9 in the circuit shown in FIG. 1. In short, the wirings L1 through L4 allocated to the connections to the external connecting terminals C10 through C13 in the interface unit 11 of the interface controller 7 are connected to their corresponding terminals Vcc, I/O-ic, CLK-ic and RES-ic of the IC card microcomputer 9. A separation switch circuit 12 is cut off under the control of the interface controller 7 when the interface controller 7 communicates with the CI card microcomputer 9 in the 8-bit mode to thereby separate the connections to the external connecting terminals C10, C11 and C13. Further, when the interface controller 7 communicates with the outside with the external connecting terminal C12 as the DAT6, the separation switch circuit 12 separates the connection to the corresponding terminal Vcc of the IC card microcomputer 9 and performs, on the MRYC 5 side, a function selection based on the difference between each of the functions of the data terminal DAT4 through DAT7 allocated to the external connecting terminals C10 through C13 in the 8-bit mode and each of the functions of the terminals Vcc, I/O, CLK and RES respectively connected to the wirings L1 through L4.

The supply of operating power supplies to the IC card microcomputer 9 will now be described with reference to FIG. 1. The memory card has the external connecting terminal (second external connecting terminal) C15 capable of supplying an operating power supply Vcc-IC to the IC card microcomputer 9 aside from the external connecting terminal (first external connecting terminal) C4 for supplying an operating power supply Vdd to the interface controller 7 and flash memory 8. Although the supply of the operating power supplies to the IC card microcomputer 9 is performed by the external connecting terminals C12 and C15 under the configuration shown in FIG. 1, the supply of the operating power supply by the external connecting terminal C12 is not essential. This can be substituted with the external connecting terminal C15. Incidentally, a switch SW1 of the separation switch circuit 12 is a switch required due to the addition of the external connecting terminal C15. That is, this is done because the operating power supply Vcc-IC is always supplied from the wiring L4 to the external connecting terminal C15 regardless of any use form of the terminal C12.

The terminal C15 supplies the operating power supply even to the interface unit 11 and resolves both a reduction in input impedance of an input/output circuit of the interface unit 11 connected to the wirings L1 through L4 and an output indefinite state in a state of the stop of the supply of the operating power supply Vdd from the terminal C4. That is, when the output state of an output buffer in the interface unit 11 becomes indefinite when the supply of the power supply Vdd from the terminal C4 is stopped to suppress needless power consumption where only the IC card microcomputer 9 of the MRYC 5 is operated, the IC card microcomputer 9 is power-on reset by the contact interface using the terminals C10 through C13 in this condition to activate the IC card microcomputer. At this time, for example, a clock signal sent from the terminal C11 flows into the output buffer of the interface unit 11 to cause a flow of overcurrent. Alternatively, a signal inputted/outputted via the terminal C13 similarly flows into the output buffer of the interface unit 11 to cause an overcurrent to flow. Such an overcurrent results in noise and increases needless power consumption. Further, such noise degrades sensitivity and communication characteristics at the non-contact interface via the antenna 10. Upon the stop of the supply of the operating power supply to the interface controller 7, the operating power Vcc-IC for the IC card microcomputer 9 is supplied from the terminal C15 to the interface unit 11 to thereby resolve the output indefinite state of the output buffer of the interface unit 11 connected to the wirings L1 through L4.

In order to resolve the indefinite state, the output buffer connected to the wirings L1 through L4 is controlled to a high impedance state in response to the stop of the supply of the power supply Vdd.

Figure 4:
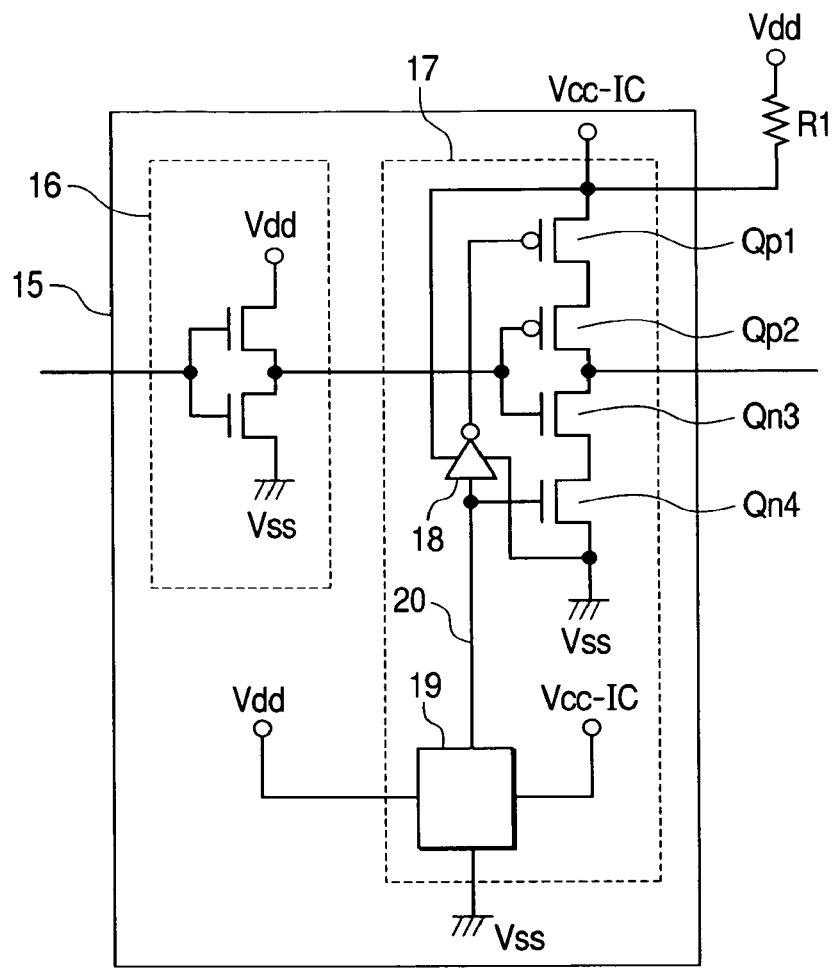
FIG. 4 is a circuit diagram illustrating an output buffer controllable to a high output impedance state in response to a power supply cutoff.

An output buffer controllable to a high impedance state in response to the stop of the supply of a power supply Vdd is illustrated in FIG. 4. The output buffer 15 has a series circuit comprising, for example, a CMOS inverter 16 with Vdd as an operating power supply and a CMOS clocked inverter 17 with Vcc-CI as an operating power supply. The CMOS clocked inverter 17 is configured with a series circuit of p channel type MOS transistors Qp1 and Qp2 and n channel type MOS transistors Qn3 and Qn4 as a principal part and includes an inverter 18 which switch-controls the MOS transistors Qp1 and Qn4 and a power supply voltage detector 19. The power supply voltage detector 19 outputs a detect signal 20 which is brought to a high level of a Vcc-IC level when the power supply voltage Vdd is turned on and exceeds an operation guarantee voltage, and is brought to a low level corresponding to a circuit's ground voltage Vss when the supply of the power supply voltage Vdd is cut off. The inverter 18 uses the Vcc-IC as an operating power supply. Thus, when the Vcc-IC is in a power-on state and the Vdd is being supplied, the clocked inverter 17 is set so as to be capable of output operation. When the supply of the Vdd is cut off, the clocked inverter 17 is controlled to a high impedance state. Incidentally, the power supply Vdd is connected to the power supply of the clocked inverter 17 via a high resistor R1 to perform operation stabilization when the Vcc-IC is cut off.

In FIG. 4, consideration is given to the fact that the Vdd and the Vcc-IC differ in level and Vdd≦Vcc-IC. That is, when the logical threshold value (VTL) of the inverter 16 is taken as Vdd/2, the logical threshold value of the clocked inverter 17 is also brought to Vdd/2 in matching with it. In short, the output buffer 15 has a level shift function which performs or makes a level shift between a signal level based on the power supply voltage Vdd and a signal level based on the power supply voltage Vcc-IC.

Figure 5:
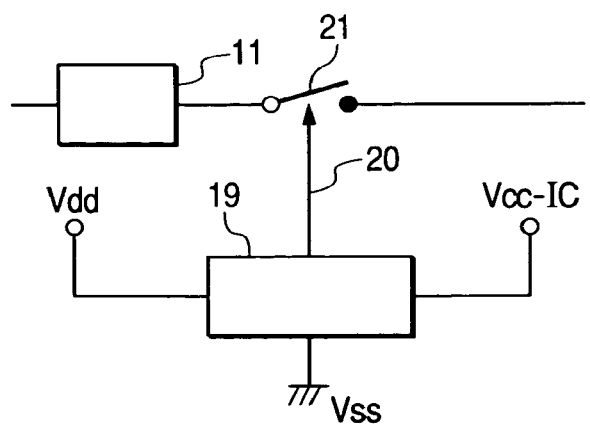
FIG. 5 is an explanatory view showing an example in which a bus switch is adopted to resolve an output indefinite state of the interface unit at power-off.
Figure 6:
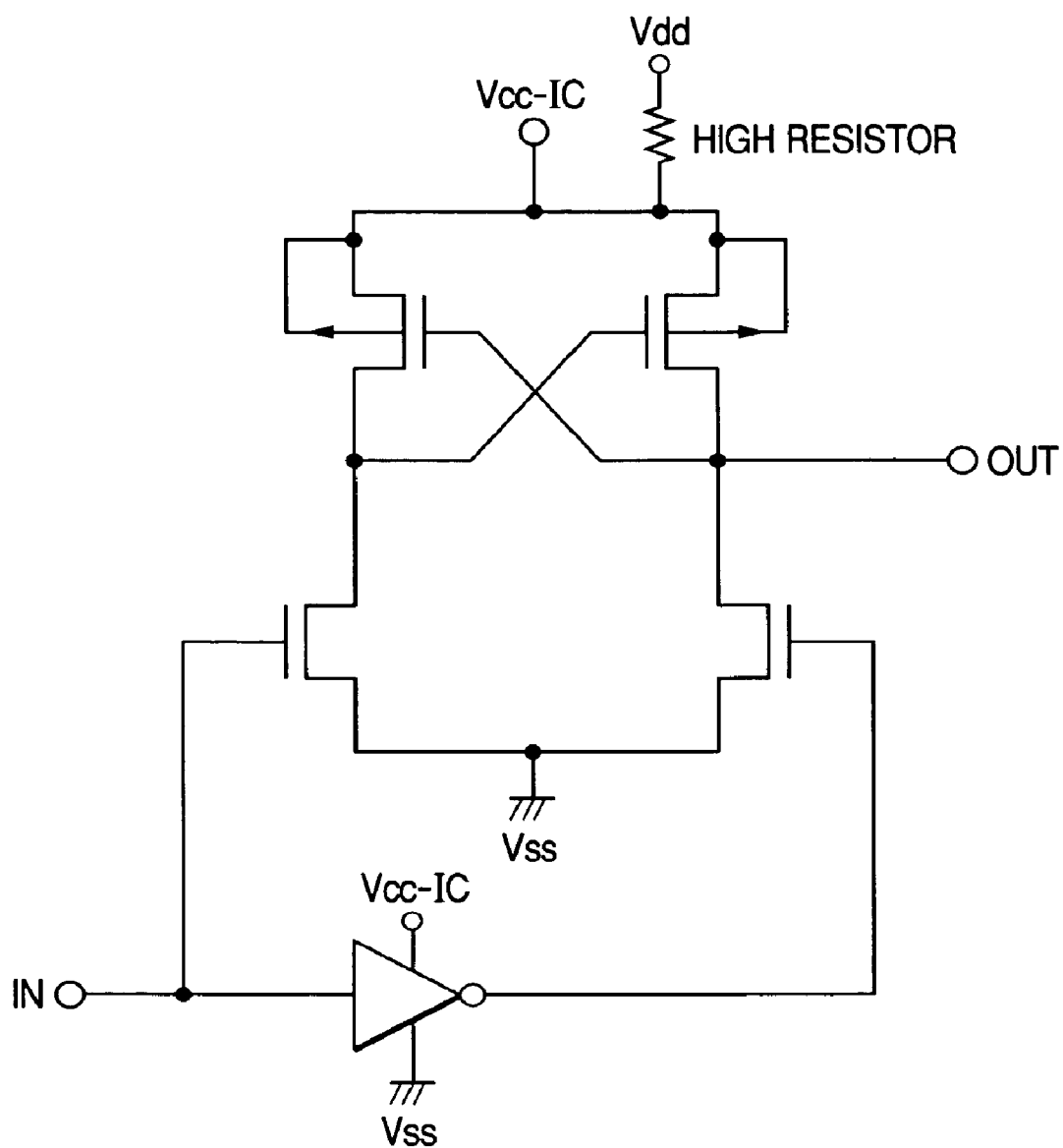
FIG. 6 is a circuit diagram depicting a circuit in which a differential amplifier is used for level shifting.

Incidentally, the resolution of the output indefinite state of the interface unit at cut-off of the power supply Vdd is not limited to the control of the output buffer 15 having the level shift function to the high impedance. As illustrated in FIG. 5, a bus switch 21 brought to an off state upon cut-off of the power supply Vdd is adopted for disconnection of the interface unit 11 from the IC card microcomputer. A circuit using such a differential amplifier as shown in FIG. 6 may be provided in the interface unit 11 for the purpose of level shifting. The connection of a power supply Vdd to a power supply of the differential amplifier shown in FIG. 6 via a high resistor R1 aims to achieve operation stabilization at the cut off of the Vcc-IC.

Figure 7:
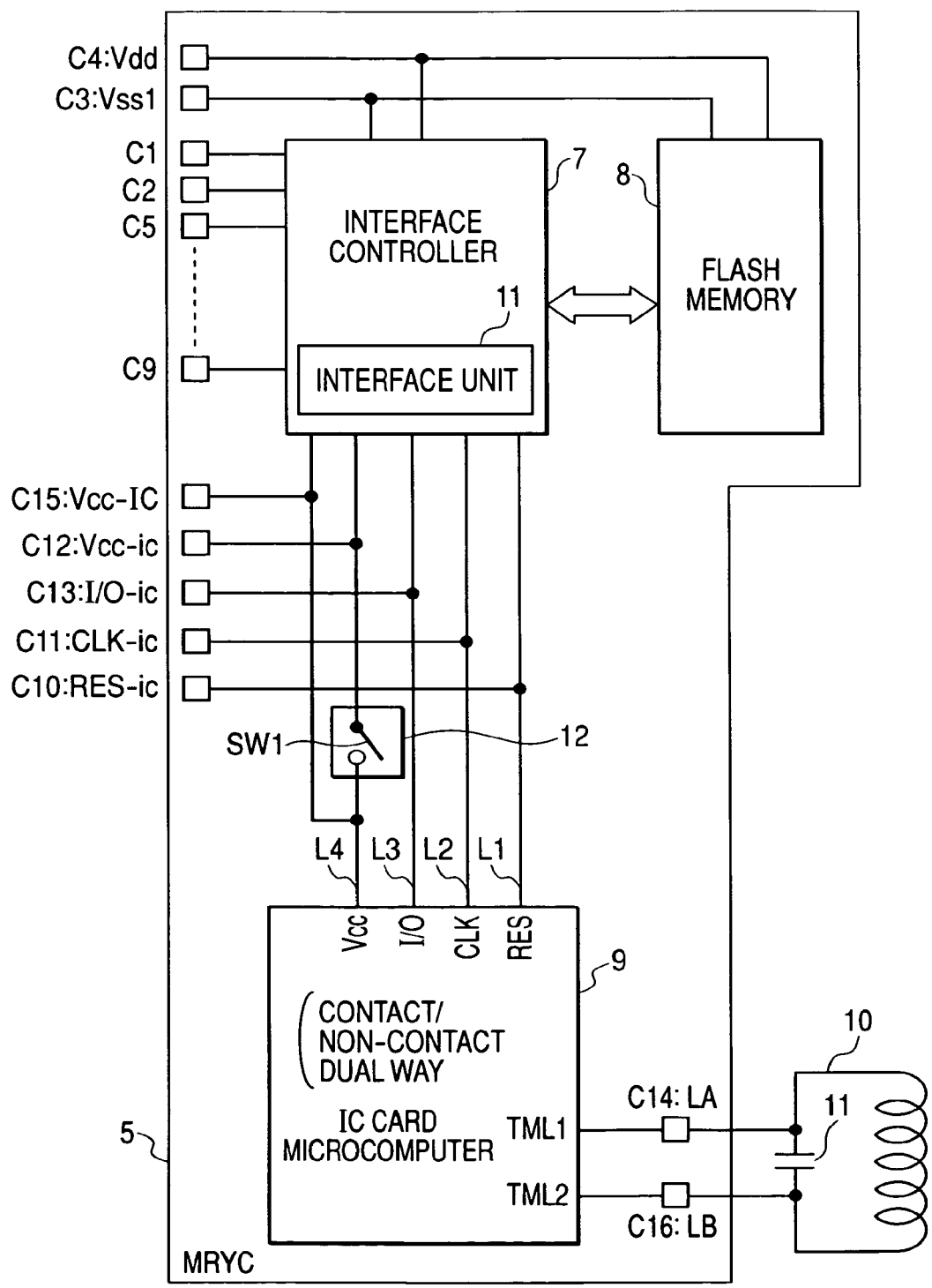
FIG. 7 is a block diagram showing a second configurational example of the memory card according to the present invention.

A second configurational example of the MRYC 5 is shown in FIG. 7. A separation switch circuit 12 is constituted of only a switch SW1 as compared with FIG. 1. There is no need to provide the switches cut off under the control of the interface controller 7 when the interface controller 7 communicates with the IC card microcomputer 9 in the 1-bit mode or 4-bit mode to thereby separate the connections to the external connecting terminals C10, C11 and C13. A function selection based on the difference between each of functions of data terminal DAT4 through DAT7 allocated to the external connecting terminals C10 through C13 in a 8-bit mode and each of functions of terminals Vcc, I/O, CLK and RES respectively connected to wirings L1 through L4 in the 1-bit mode or 4-bit mode may be performed outside the MRYC 5. The MRYC 5 is identical in other configuration to FIG. 1.

Figure 8:
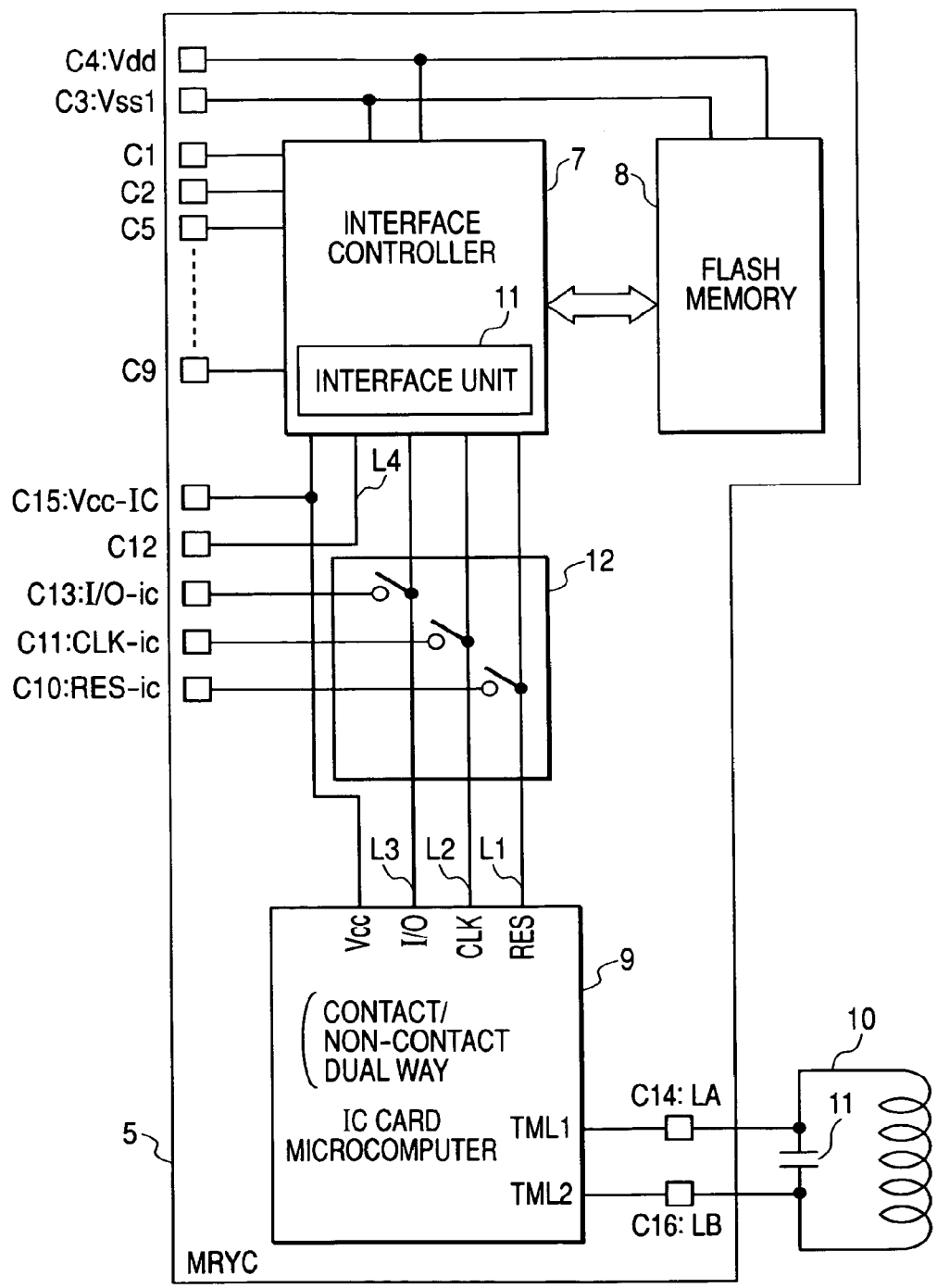
FIG. 8 is a block diagram showing a third configurational example of the memory card according to the present invention.

A third configurational example of the MRYC 5 is shown in FIG. 8. The supply of an operating power supply to an IC card microcomputer is carried out by only a terminal C15 with respect to the configuration shown in FIG. 1. The switch SW1 becomes unnecessary. Although not shown in the drawing in particular, it is also possible to adopt a configuration wherein FIGS. 7 and 8 are utilized in combination to thereby eliminate or take off the whole separation switch circuit 12.

Figure 9:
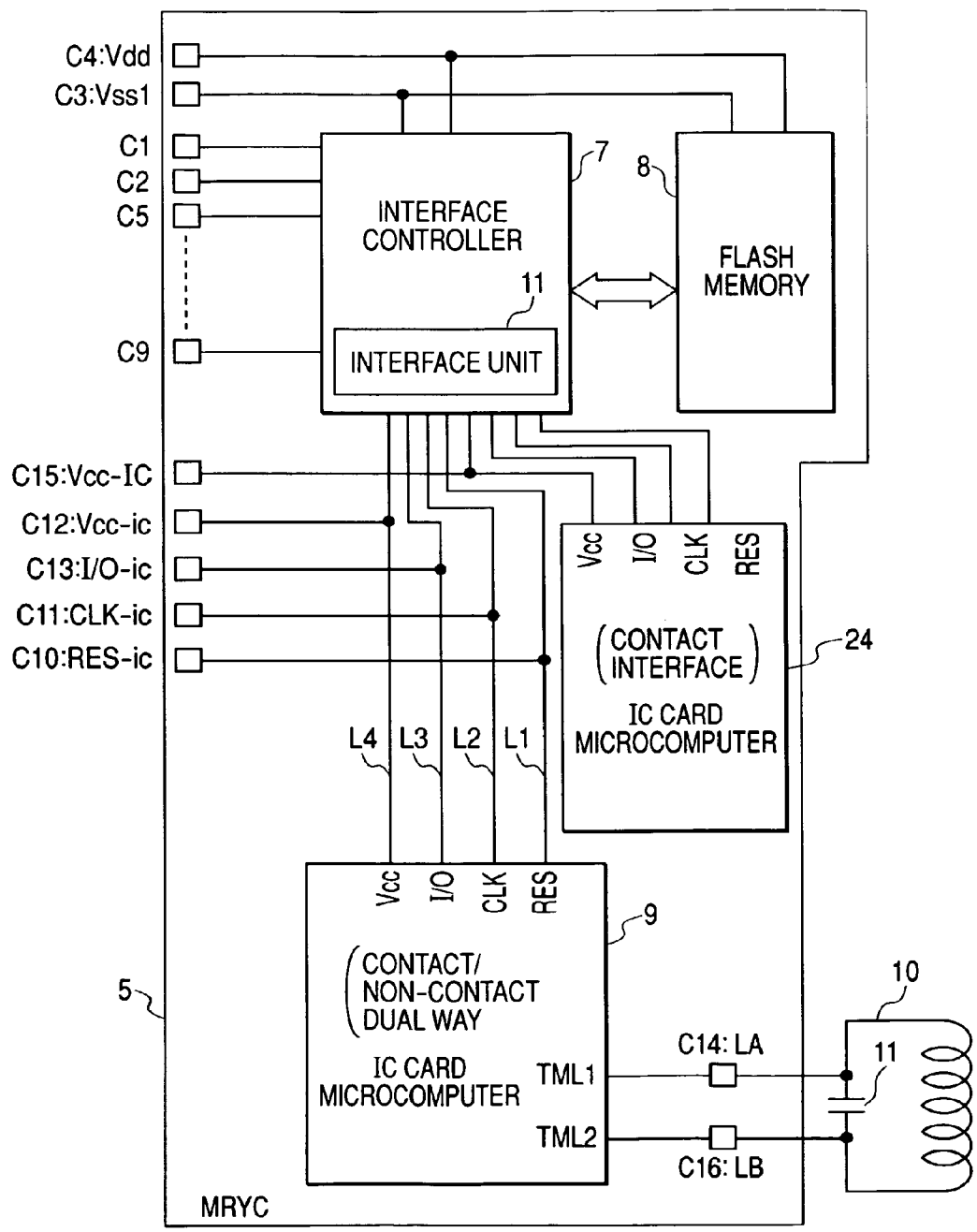
FIG. 9 is a block diagram showing a fourth configurational example of the memory card according to the present invention.

A fourth configurational example of the MRYC 5 is shown in FIG. 9. Although no separation switch circuit 12 is shown in the drawing, the MRYC 5 shown in the same drawing has an IC card microcomputer 9 having a connection relationship of FIG. 7 or 8, and further includes only a contact interface. The MRYC 5 is configured with being equipped with another IC card microcomputer 24 connected to only an interface unit 11 of an interface controller 7. The MRYC 5 is similar in other configuration to FIG. 1. In the present embodiment, the IC card microcomputer 24 serves as a coprocessor of the interface controller 7. Thus, the MRYC 5 is not operated independently by the IC card microcomputer 24 alone.

Figure 10:
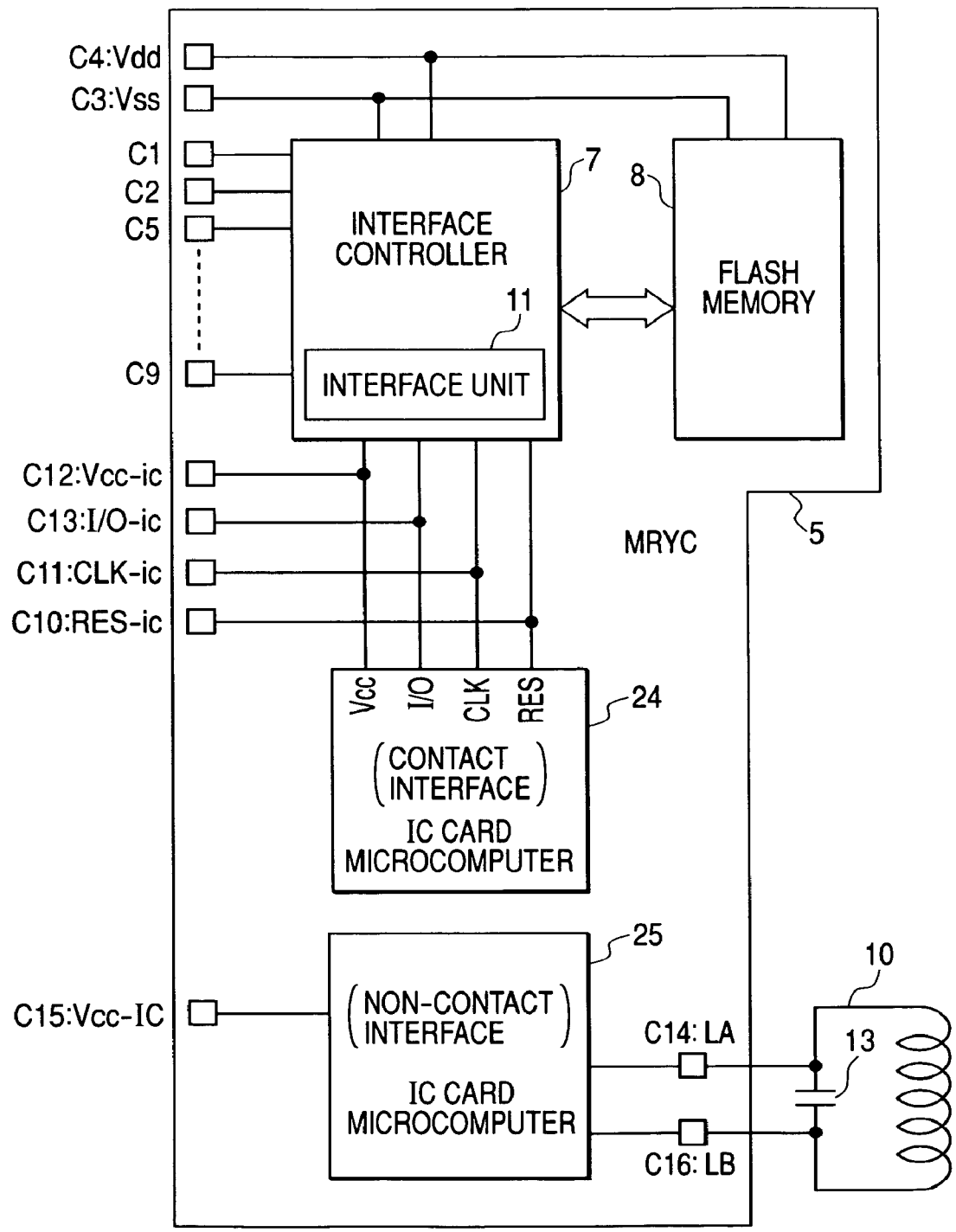
FIG. 10 is a block diagram showing a fifth configurational example of the memory card according to the present invention.

A fifth configurational example of the MRYC 5 is shown in FIG. 10. The MRYC 5 shown in the same drawing is configured with being further equipped with another IC card microcomputer 25 having only a non-contact interface with respect to the configuration shown in FIG. 7 or 8. The supply of an operating power supply to the IC card microcomputer 24 is carried out by C12 (Vcc-ic). The supply of an operating power supply to an IC card microcomputer 24 is carried out by C15 (Vcc-IC). Since the IC card microcomputer 25 having the non-contact interface is capable of using an induced electromotive force produced when an electromagnetic wave comes across an antenna 10, as its operating power supply, the supply of the operating power supply to the IC card microcomputer 25 from the terminal C15 is not essential. The supply of the operating power supply from the terminal C15 is significant where an attempt is made to perform operation's stabilization by stabilization of the power supply of the IC card microcomputer 25.

Figure 11:
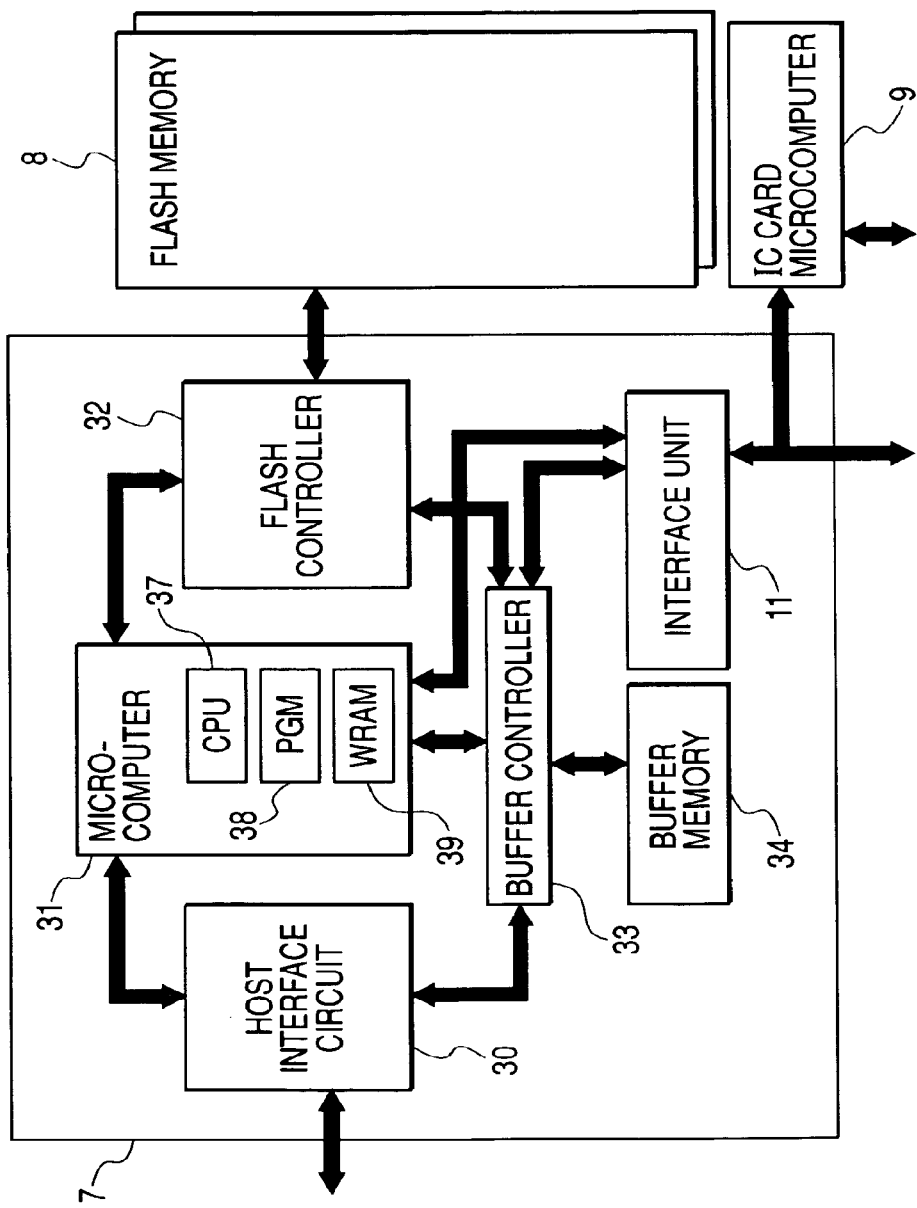
FIG. 11 is a block diagram illustrating the details of an interface controller.

The details of the interface controller 7 are illustrated in FIG. 11. The interface controller 7 comprises a host interface circuit 30, a microcomputer 31, a flash controller 32, a buffer controller 33, a buffer memory 34 and an interface unit 11. The buffer memory 34 comprises a DRAM (Dynamic Random Access Memory) or SRAM (Static Random Access Memory) or the like. An IC card microcomputer 9 is connected to the interface unit 11. The microcomputer 31 comprises a CPU (Central Processing Unit) 37, a program memory (PGM) 38 holding operation programs of the CPU 37 therein, and a work memory (WRAM) 39 used in a work area of the CPU 37, etc. Control programs related to interface control forms corresponding to the MMC specs are retained in the PGM 38.

When the host interface circuit 30 issues a memory card initialize command, it allows the microcomputer 31 to execute a control program of an MMC interface control form by an interruption. The microcomputer 31 executes its control program to thereby control an external interface operation of the host interface circuit 30 and control access (write, erase and read operations) to a flash memory 8 by the flash controller 32 and data management, thereby controlling format conversion between a data format inherent in a memory card and a data format common to a memory by the buffer controller 33.

The buffer memory 34 temporarily holds data read from the flash memory 8 or data written into the flash memory 8. The flash controller 32 operates the flash memory 8 as a hard disk-compatible file memory and manages data in sector units.

Incidentally, the flash controller 32 is provided with an unillustrated ECC circuit. The flash controller 32 adds an ECC code upon storage of data in the memory and effects an ECC code-based error detect/correct process on read data.

Figure 12:
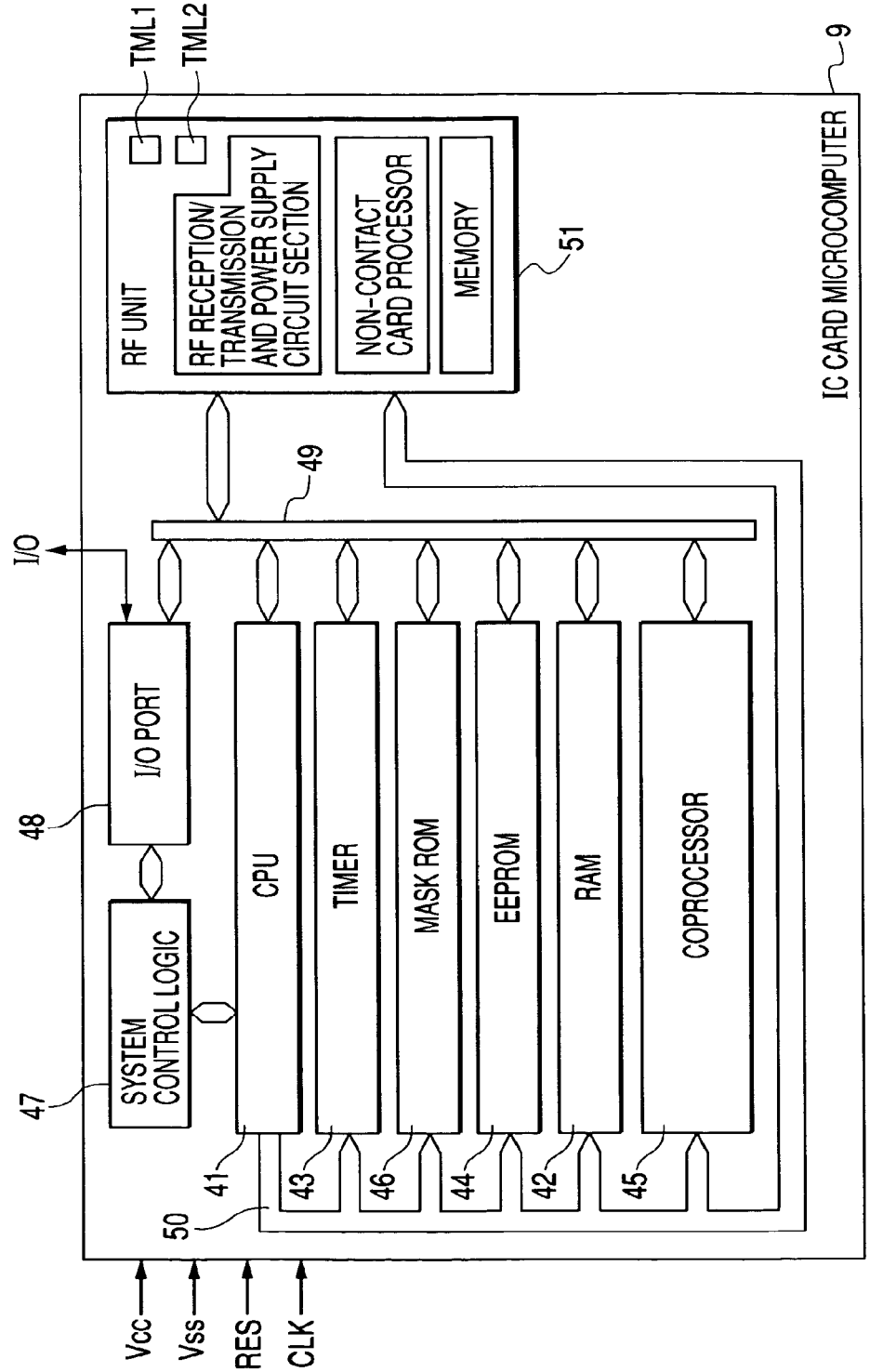
FIG. 12 is a block diagram showing a specific example of a dual-way IC card microcomputer.

The details of the IC card microcomputer 9 are illustrated in FIG. 12. The IC card microcomputer 9 includes a CPU 41, a RAM (Random Access Memory) 42 used as a work RAM, a timer 43, an EEPROM (Electrically Erasable and Programmable Read Only Memory) 44, a coprocessor 45, a mask ROM (Read Only Memory) 46, a system control logic 47, an input/output port (I/O port) 48, a data bus 49, an address bus 50 and an RF unit 51.

The mask ROM 46 is used to store operating programs (encrypt program, decrypt program, interface control program, etc.) and data therein. The RAM 42 serves as a work area of the CPU 41 or a temporary storage area of data and comprises, for example, an SRAM (Static Random Access Memory) or a DRAM (Dynamic Random Access Memory). When an IC card command is supplied to the I/O port 48, the system control logic 47 decodes it and causes the CPU 41 to execute a processing program necessary to execute the command. That is, the CPU 41 obtains access to the mask ROM 46 in accordance with an address instructed from the system control logic 47 to fetch an instruction and decodes the fetched instruction and performs operand fetch and a data computation on the basis of the result of decoding. The coprocessor 45 performs surplus computing processing or the like at RAS and elliptic curve cryptographic computations under the control of the CPU 41. The I/O port 48 has 1-bit input/output terminal I/O and shares the input/output of data and the input of an external interrupt signal. The I/O port 48 is connected to the data bus 49, and the CPU 41, RAM 42, timer 43, EEPROM 44 and coprocessor unit 45, etc. are connected to the data bus 49. The system control logic 47 performs control on the operation modes of the IC card microcomputer 9 and its interrupt control and further has a random number generation logic used to generate a cipher key, etc. When the IC card microcomputer 9 is instructed to perform a reset operation in accordance with a reset signal RES, its interior is initialized so that the CPU 41 starts instruction execution from the leading address of the program in the mask ROM 46. The IC card microcomputer 9 is operated in sync with a clock signal CLK.

The EEPROM 44 is capable of performing electrically erasable and programmable processes and is used as an area which stores ID information and data on an authentic certificate or the like used to specify each individual. As an alternative to the EEPROM 44, a flash memory or a ferroelectric memory or the like may be adopted. The IC card microcomputer 9 supports one or both of a contact interface which makes use of external connecting terminals upon interface to the outside and a non-contact interface using an antenna. The RF unit 51 for performing the non-contact interface has antenna terminals TML1 and TML2 of a chip. When power is supplied from the RF unit 51 via the antenna or the non-contact interface is selected by the system control logic 47 via an internal bus, the RF unit 51 generates an induced electromotive force caused by causing the antenna to cross a predetermined electromagnetic wave (e.g., variable magnetic flux of high frequency, or microwave) as an operating power supply, generates an internal clock signal CLK based on an induced current caused corresponding to the frequency of the predetermined electromagnetic wave, internal data obtained by separating data transferred with being superimposed on the predetermined electromagnetic wave by the RF unit 51 and a reset signal RES respectively, and performs the input/output of information in a non-contact form through the antenna. The RF unit 51 operated via the non-contact interface inside the IC card microcomputer 9 may preferably be constituted of small-scaled circuits independent of the IC card operating CPU 41 or the like operated via the contact interface. The RF unit 51 is provided thereinside with circuits necessary for a non-contact card operation, such as a non-contact card processor, a memory used for a control program area and a work area of the processor, and an RF transmission/reception and power circuit unit. Thus, since the RF unit 51 is configured of the independent small-scaled circuits, like the processor function and its control program, it becomes easy to operate the circuits by an induced electromotive force given from outside even in the case of, for example, such an environment that the supply of power via contact terminals. Also the RF unit 51 is capable of performing even the input/output of data between the non-contact interface section and the contact interface section via the internal data bus 49 and address bus 50.

A security processing operation of the MRYC 5 will be explained. For instance, user identification information is stored in a secure area of the flash memory 8. When contents data is downloaded, license information encrypted with the user identification information as a secret key is downloaded together. A decrypt key for decrypting the contents data is contained in the license information and the license information is decrypted by using the user identification information in the decrypt key. Thus, copyright protection against the contents data is carried out. Such security processing is done under program control of the microcomputer 31.

Security processing made by the IC card microcomputer 9 will be described. For example, the IC card microcomputer 9 realizes an authenticated function based on evaluation/authentication body of ISO/IEC15408 available for electronic banking services or the like. The EEPROM 44 holds a predetermined authenticated certificate therein. When an authentication request is made from the host, the EEPROM 44 sends its authenticated certificate and is capable of performing a subsequent communication process on condition that the securing of authentication for it is met. An operation program for such security processing is retained in the mask ROM 46. It is desirable to carry out the authentication process of the IC card microcomputer 9 under the closed environment in the IC card microcomputer 9 from the viewpoint of security. In terms of such a point, there is the significance that only the power supply of the IC card microcomputer 9 is turned on to perform an external interface via the external connecting terminals C10 through C13 or the antenna. When no security problem occurs in terms of uses or technically, the security processing may be done via the interface controller 7. In the process up to the shipment of a product after the fabrication of the MRYC, writing of various application software into the IC card microcomputer 9 and card issuing processing can easily be performed via the external connecting terminals C10 through C13.

When, for example, the IC card microcomputer 9 is authenticated by the evaluation/authentication body of ISO/IEC15408 available for the electronic banking services or the like as described above, it is possible to insert the MRYC 5 into a card holder for a cash card, a credit card or a commutation ticket or the like and realize their card functions by a non-contact interface.

When consideration is given to the fact that the IC card microcomputer 9 is used for a high level of security processing such as electronic banking or the like, there is a high possibility that power-on reset for initializing all internal states with respect to an abnormal state of the IC card microcomputer 9 will be frequently done as compared with the interface controller 7 or the like. Considering it, the power-on reset is freely enabled by the IC card microcomputer 9 itself without resetting the whole MRYC 5 since the IC card microcomputer 9 is provided with the dedicated power supply terminals C12 (Vcc-ic) and C15 (Vcc-IC). Thus, it is possible to improve the liberty of the MRYC 5 while insuring safety.

<<Arrangement of External Connecting Terminals of MRYC>>

Figure 13:
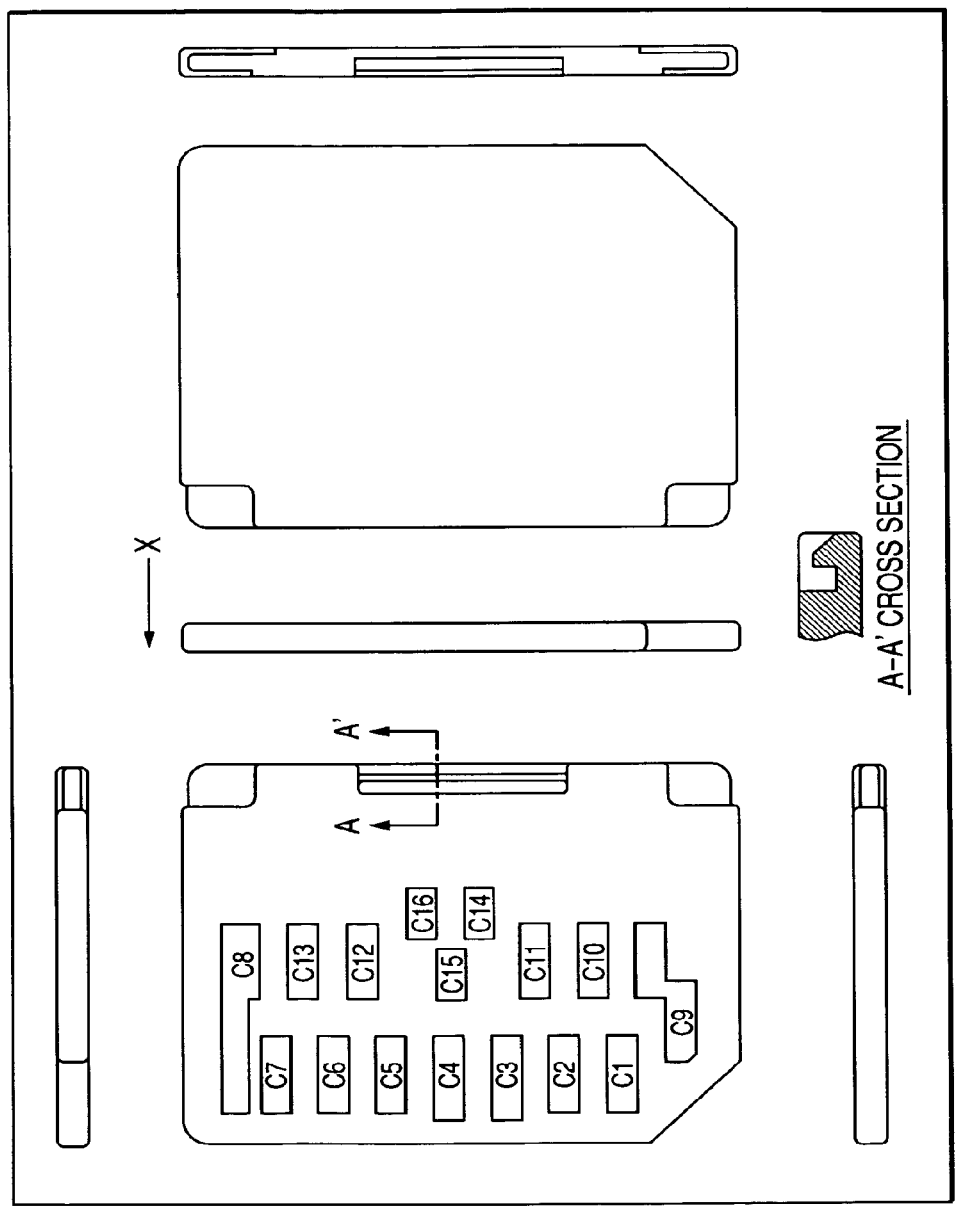
FIG. 13 is an explanatory view showing an outward appearance of the memory card according to the present invention at the time that the memory card is encapsulated in a package of a standard size based on MMC standards.
Figure 14:
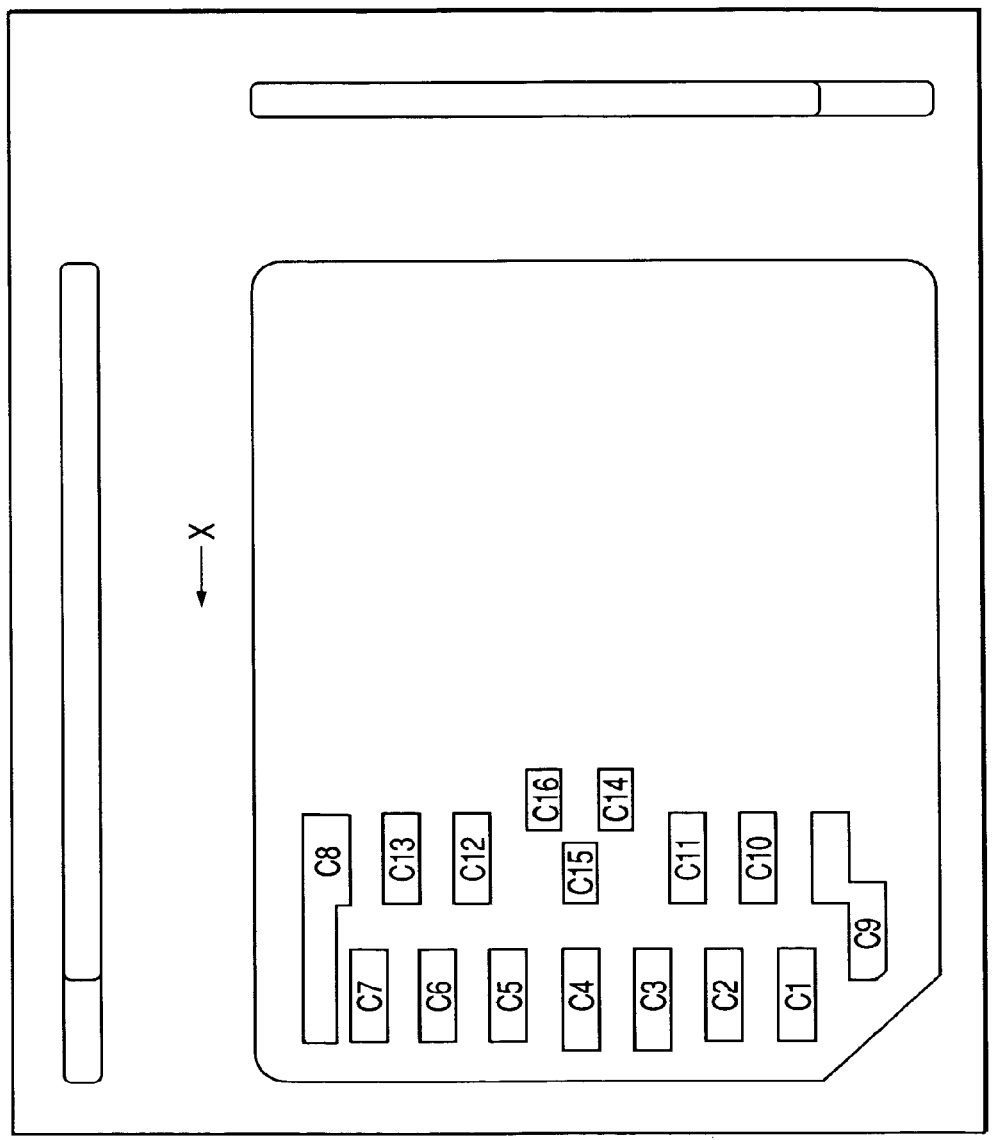
FIG. 14 is an explanatory view showing an outward appearance of the memory card according to the present invention at the time that the memory card is encapsulated in a package of a half size based on the MMC standards.

An external appearance of the MRYC 5 at the time that it is encapsulated in a package of a half size based on the MMC standards, is shown in FIG. 13. An external appearance of the MRYC 5 at the time that it is encapsulated in a package of a standard size based on the MMC standards, is shown in FIG. 14. Arrangements of external connecting terminals are clearly shown in both drawings. Their arrangements are both made equal to each other. Functional allocations of the terminals C1 through C16 are shown as described in FIG. 3. The terminals C1 through C7 correspond to the primitive MMC standards. The terminals C8 and C9 are extension terminals for a 4-bit mode, the terminals C10 through C13 are extension terminals for an IC card microcomputer contact interface and a 8-bit mode, the terminals C14 and C16 are external antenna connecting extension terminals, and the terminal C15 is a power supply extension terminal dedicated for the IC card microcomputer. The terminals C1 through C16 have zigzag layouts in which column directional arrangements are shifted among columns adjacent to one another in the vicinity of the direction (direction indicated by arrow X) to insert a memory card. A first column corresponds to the terminals C1 through C7. The terminals C8 through C13 constitute a second column disposed away from an external connecting terminal column of the first column. The external connecting terminals of C10 through C13 are identical in size to the external connecting terminals of C1 through C7 within a predetermined range. The external connecting terminal of C8 is placed in the first column and extends to a position where it perfectly adjoins the terminal C7 at a column directional end of a connector terminal column as viewed in the column direction. The external connecting terminal of C9 is placed in the first column and extends to a position where it partly overlap with the terminal C1 of the terminal column and adjoins it as viewed in the column direction. In the external connecting terminal column of the first column and the external connecting terminal column of the second column, the column directional arrangements of the external connecting terminals are shifted to one another as viewed in the column direction and laid out in zigzag form.

Owing to the zigzag layout, an unillustrated card slot in which the MRYC 5 is mounted, is capable of coping with multi-terminating by the relatively simple configuration that a lot of slot terminals (pins) thereof are alternately laid out in parallel while their amounts of protrusion are being changed. In terms of such multi-terminating, the terminals C14 through C16 newly provided in an area between the terminals C11 and C12 lying in the subsequent column are also laid out in zigzag form.

When antenna connecting terminals C14 and C16 to which the high-frequency antenna 10 for non-contact interface is connectable, are provided as the external connecting terminals, the antenna connecting terminals C14 and C16 are disposed in the neighborhood of the power Vdd supply external connecting terminal C4, adjacent to the external connecting terminal C15 used as the IC card microcomputer dedicated power supply terminal. Such antenna connecting terminals C14 and C16 are used to connect the external high-frequency antenna in order to increase the sensitivity of the non-contact interface at the IC card microcomputer. The voltage applied to the antenna connecting terminals C14 and C16 is relatively high and high in frequency too. Thus, when routing of wirings extending to connecting terminals for signals and a clock or the like and routing of wirings extending to the external antenna connecting terminals C14 and C16 are complexified and thereby often adjoin each other and stride over the wiring board of the MRYC 5, noise is carried on the signal lines and clock wiring by crosstalk and induction or the like. Alternatively, the noise produced due to the crosstalk and induction or the like from the signal lines and clock wiring is carried on a high-frequency signal received from the external high-frequency antenna, so that an error occurs in data separated by the RF unit 51. Since the antenna connecting terminals C14 and C16 are adjacent to the external connecting terminal C15 used as the IC card microcomputer dedicated power supply terminal and disposed in the vicinity of the power Vdd supply external connecting terminal C4, their layout results in a layout suitable for suppressing the occurrence of noise to the utmost.

Figure 15:
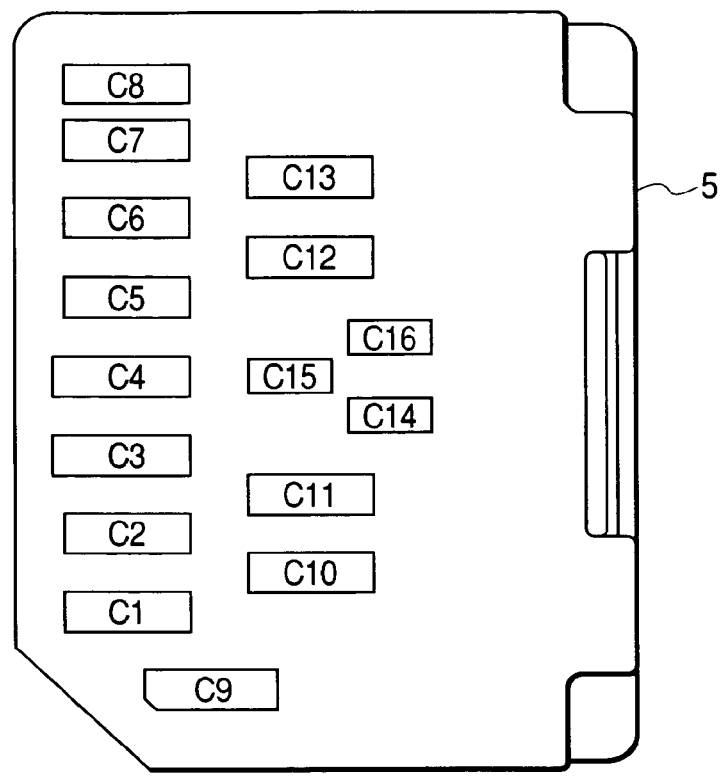
FIG. 15 is an explanatory view showing an example in which the shapes of external connecting terminals shown in FIGS. 13 and 14 are partly changed.
Figure 16:
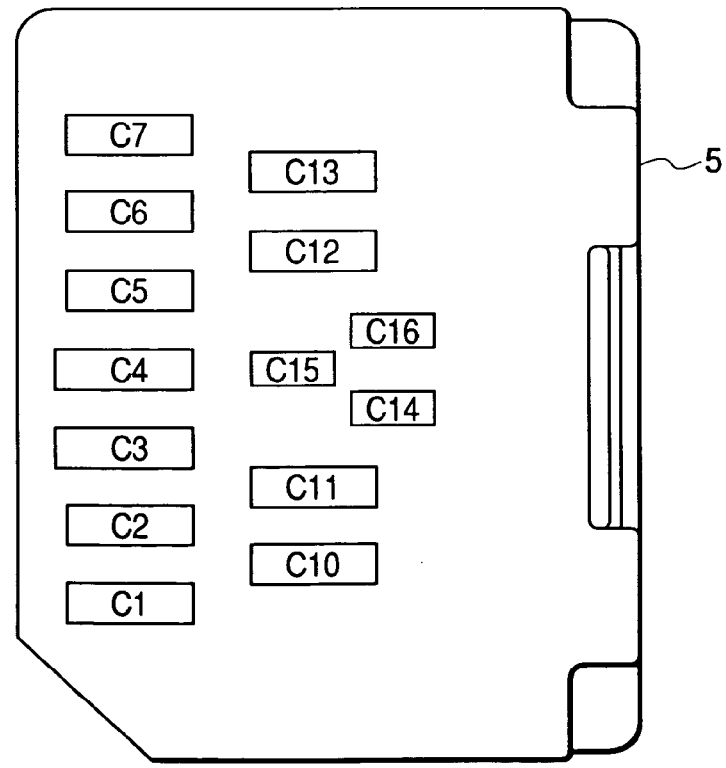
FIG. 16 is an explanatory view showing an example in which the number of the external connecting terminals shown in FIGS. 13 and 14 is reduced.

The shapes of the external connecting terminals described in FIGS. 13 and 14 can be partly changed as shown in FIG. 15. The shapes of the terminals C9 and C8 are made short here. The positions of the terminals brought into contact with the C8 and C9 of the card slot are ones intended for coping with the card slot lying in the first column. As illustrated in FIG. 16 by way of example, the number of external connecting terminals can also be reduced. This example results in a terminal array in which the external connecting terminals C8 and C9 are abolished or taken off and a 1-bit mode based on the MMC standards and a contact interface support of the IC card microcomputer are taken into consideration. FIGS. 15 and 16 are also following the zigzag layout of the external connecting terminals and the relationship of layout between the antenna connecting terminals of C14 and C16 and the IC card microcomputer dedicated power supply terminal C15 as they are.

<<Insertion into Card Slot and its Power Supply>>

The process of inserting a memory card into its corresponding card slot and the supply of power to the memory card, which has been obtained from the consideration of its process, are shown in FIGS. 23 through 26.

Figure 23:
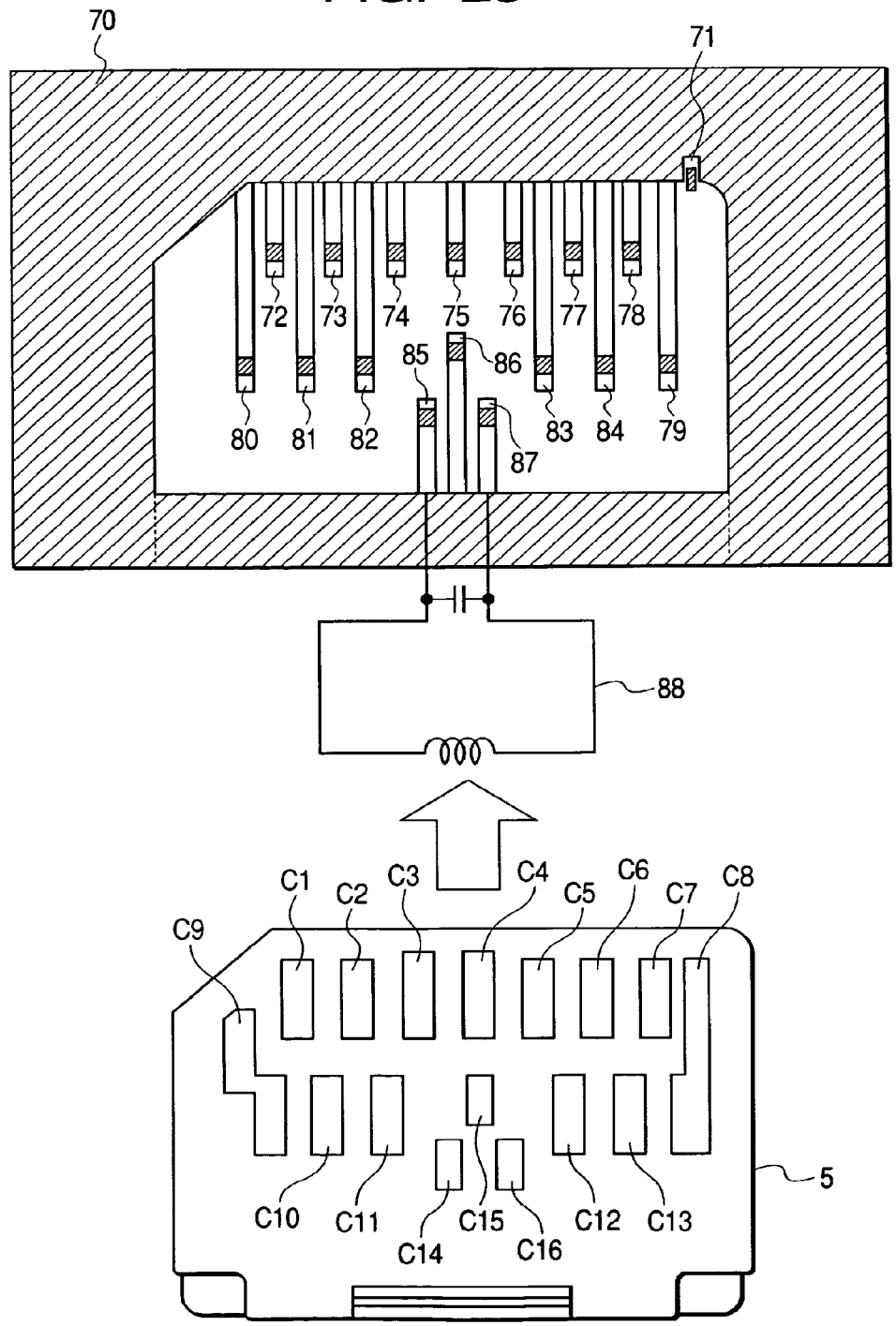
FIG. 23 is an explanatory view showing a memory card and a card slot into which the memory card is inserted.

A memory card 5 and a card slot 70 into which the memory card 5 is inserted, are shown in FIG. 23. The card slot 70 is provided with a sensor 71 for detecting the insertion of the memory card 5 and terminals 72 through 87 respectively brought into contact with external connecting terminals C1 through C16 of the memory card 5. An external antenna 88 is connected to the terminals 85 and 87.

Figure 24:
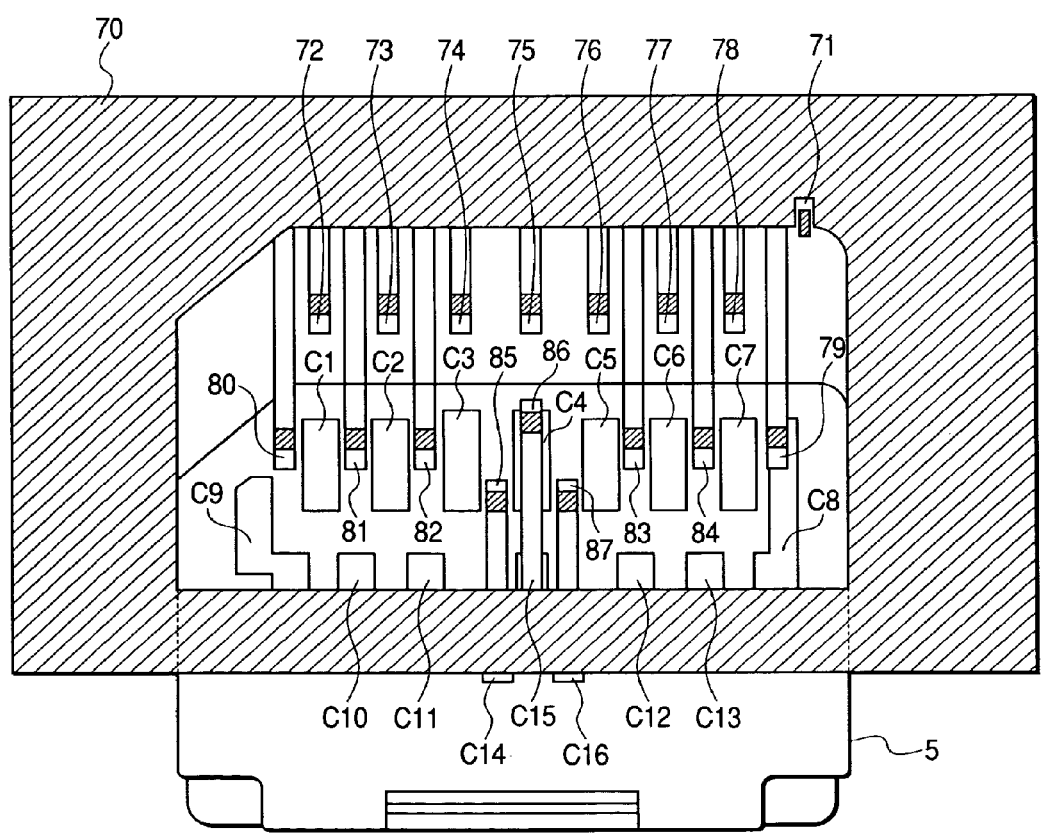
FIG. 24 is an explanatory view depicting a first process in which the memory card shown in FIG. 23 is being inserted into the card slot.

A first process in which the memory card 5 is inserted into the card slot 70, is shown in FIG. 24. At the stage of the first process, the terminal 86 connected to the terminal C15 is in contact with the terminal C4 of the memory card 5. Further, there is a possibility that the terminals 79 through 85 and 87 of the card slot 70 will contact the terminals C1 through C9 of a first column of the memory card 5. The terminal C15 of the memory card 5 is a terminal for supplying a potential Vcc-I and is supplied with a potential identical to or higher than the power supply Vdd supplied to the interface controller 7 and the flash memory 8. In this condition, the Vcc-IC is supplied to the interface controller 7 and the flash memory 8 and the terminals 79 through 85 and 87 of the card slot 70 are brought into contact with the terminals C1 through C9 of the first column of the memory card 5, thereby causing a fear that a circuit is electrically formed. Since a potential occurs in the external antenna 88 according to an external electric field, the terminals 85 and 87 are brought into contact with their corresponding terminals other than the antenna connecting terminals C14 and C16, thereby causing the fear that this potential is applied to the interface controller 7.

Figure 25:
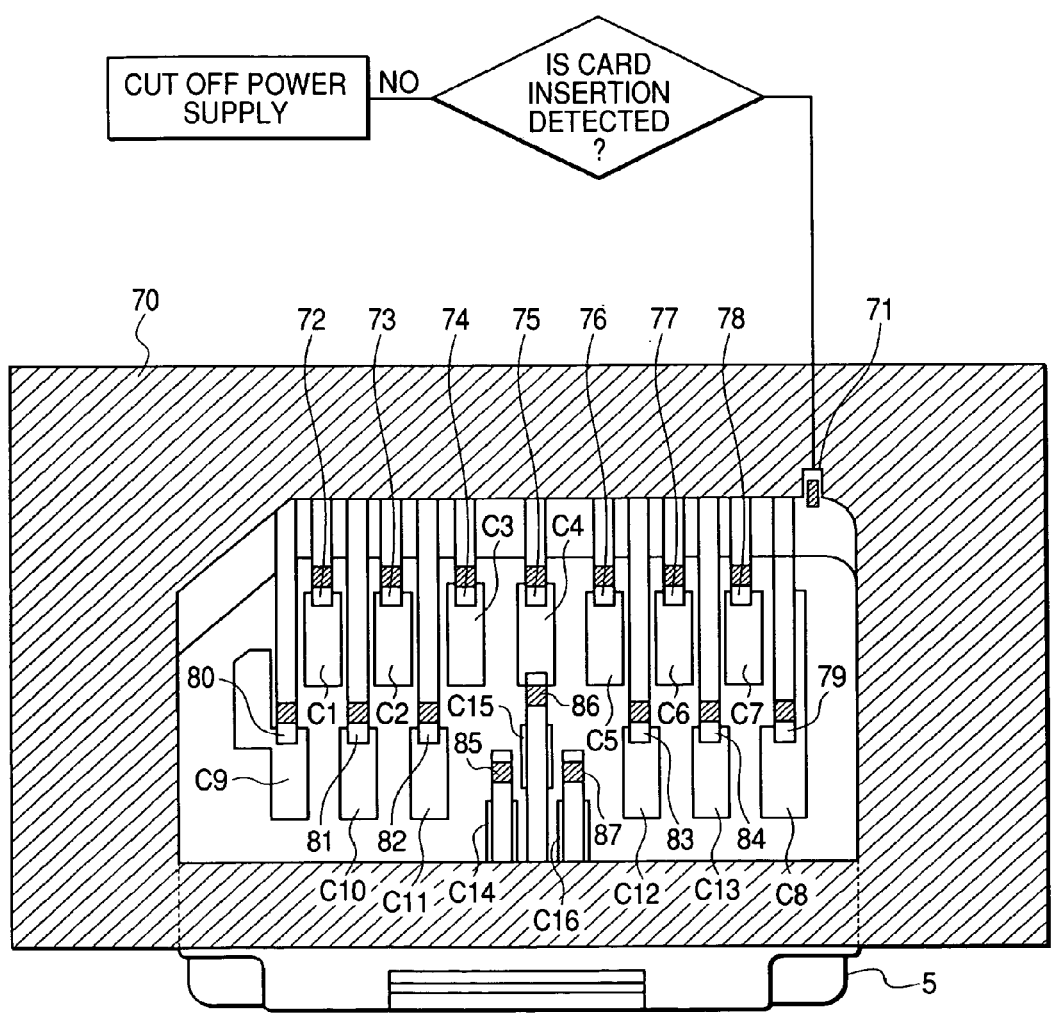
FIG. 25 is an explanatory view showing a second process in which the memory card shown in FIG. 23 is being inserted into the card slot.

A second process in which the memory card 5 is inserted into the card slot 70, is shown in FIG. 25. Although the terminals 79 through 85 and 87 of the card slot 70 are not brought into contact with the terminals C1 through C9 of the first column of the memory card 5 at the stage of the second process, there is a fear that the terminals 75 and 86 of the card slot 70 are connected to each other via the external connecting terminal C4 of the memory card and Vcc-IC is supplied to an unillustrated circuit for supplying Vdd to the terminal 75. Also there is a fear that the terminals 75 and 86 are brought into contact with the terminal C4 to supply Vcc-IC to the interface controller 7 and the flash memory 8, and the terminals 72 through 74 and 76 through 80 are brought into contact with their corresponding terminals C1 through C3 and C5 through C9 to thereby electrically form a circuit.

Figure 26:
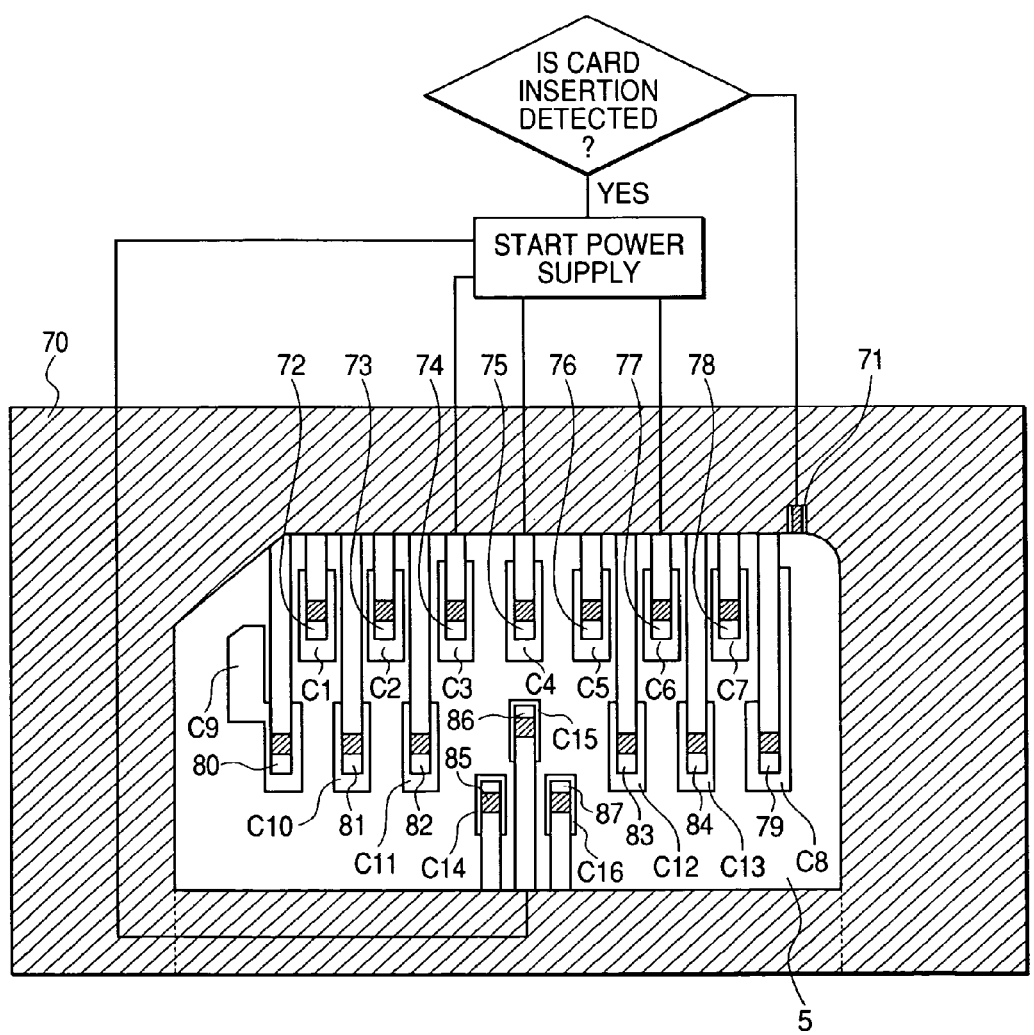
FIG. 26 is an explanatory view depicting a third process in which the memory card shown in FIG. 23 has been inserted into the card slot.

A third process in which the memory card 5 has been inserted into the card slot 70, is shown in FIG. 26. At the stage of the third process, the terminals 72 through 87 of the card slot 70 and the terminals C1 through C16 of the memory card 5 are suitably connected to one another.

As solutions to the problems that arise in the processes shown in FIGS. 24 and 25, there are provided a solution effected by the memory card 5 and a solution effected by a host device having the card slot 70.

As the solution to be effected by the memory card 5, a power circuit is provided between the terminal C4 and the interface controller 7 and flash memory 8. The supply of a power supply Vdd from the C4 is detected. Thereafter, the supply of an operating power supply to the interface controller 7 and the flash memory 8 is started and the terminals C1 through C13 may be connected to the interface controller 7.

On the other hand, as the solution to be effected by the host device, the supply of Vcc-IC and the supply of the potential generated in the external antenna 88 are started in the third process, thereby making it possible to solve the above problem. That is, the process-oriented non-contact of the terminals 72 through 87 of the card slot 70 with the terminals C1 through C16 of the memory card is detected by the sensor 71, and thereafter the supply of Vcc-IC may be started. The terminals 85 and 87 of the card slot 70 form the terminals of the memory card 5 and the card slot 70 so as not to cause the process-based contact with the terminals of the memory card 5. Alternatively, an electrically connectable/disconnectable switch circuit is provided between the external antenna 88 and the terminals 85 and 87, and the process-based non-contact is detected by the sensor 71. Thereafter, the external antenna 88 may be electrically connected to the terminals 85 and 87.

Although the respective potentials of Vdd, Vss1 and Vss2 are always supplied, the supply thereof may be started after the detection of insertion of the memory card 5 into the card slot 70 by the sensor 71. This is because the terminals 74 and 77 of the card slot 70 are terminals for supplying a reference potential and no process-based contact occurs in such a structure as illustrated in the drawing. This is also because it is considered that since the terminal 75 is a terminal for supplying Vdd corresponding to a potential identical to or lower than Vcc-IC, no particular problem arises even if the terminal 75 is connected to the terminal 86 via the terminal C4 and Vdd is supplied to an unillustrated circuit for supplying Vcc-IC.

<<Withdrawal from Card Slot and Power Supply>>

Although not shown in the drawing, consideration will be given to a case in which the memory card 5 is withdrawn from the card slot 70. In such a case, there may be cases in which when the memory card 5 is pulled out of the card slot 70 in the course of erasing of data from the flash memory 8 or writing of data therein, undesired data damage occurs and a state called deplete occurs due to the cutting off of the supply of the operating power supply to the flash memory 8, whereby the memory card 5 itself cannot be identified. In order to avoid such a matter, the host device may notify the withdrawal of the memory card 5 from the card slot 70 to the memory card 5 via a predetermined terminal where the sensor 71 detects that the memory card 5 has been pulled out of the card slot 70, and supply the potential Vdd from the terminal 86. Thus, the potential Vdd can be supplied to the terminal C4 from the second process shown in FIG. 25 to the first process shown in FIG. 24. The terminal 74 is also set so that the time required to contact the terminal C3 can be made long, specifically, the terminal 74 is set to a length taken as much length as one of the terminal 84, and the point of contact with the terminal C3 is made longer, thereby making it possible to maintain electrical connections. Owing to these, the memory card 5 is capable of completing writing of data or ensuring the time required to perform the process of avoiding at least the deplete state according to the notification of detection by the sensor 71.

<<Stacked Structure of Chip>>

Figure 17:
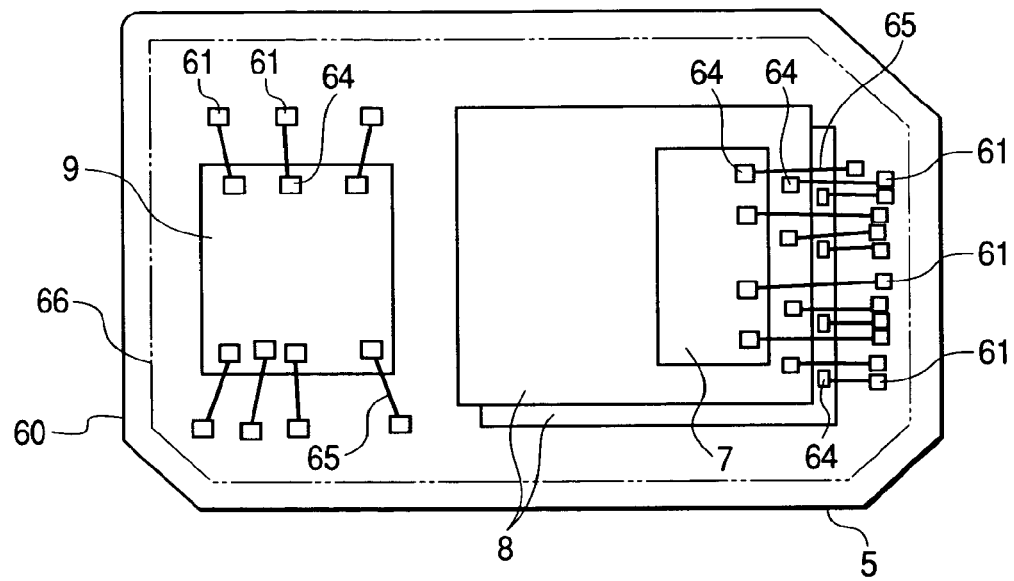
FIG. 17 is a plan view illustrating a stacked package structure including the interface controller, flash memories and IC card microcomputer respectively brought to individual semiconductor integrated circuit chips.
Figure 18:
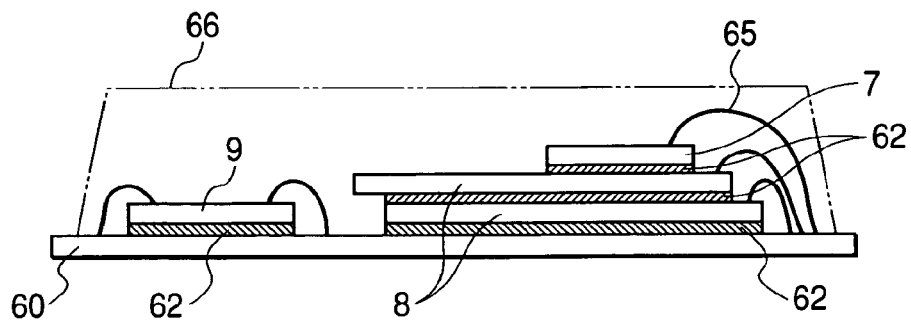
FIG. 18 is a vertical cross-sectional view of the package structure shown in FIG. 17.

A stacked package structure including the interface controller 7, flash memories 8 and IC card microcomputer 9 respectively brought to individual semiconductor integrated circuit chips is shown in FIG. 17 on a plan basis. A vertical section of the package structure is schematically shown in FIG. 18. External connecting electrodes C1 through C16 are formed over one surface of a wiring board 60 like a glass epoxy resin board formed with required wiring layers. A number of bonding pads 61 connected to required wirings are formed over the other surface thereof. The bonding pads 61 are formed of conductive patterns of alloy of aluminum, copper or iron or the like. The external connecting electrodes C1 through C16 are formed by, for example, gold-plating, nickel-plating or palladium-plating conductive patterns of alloy of aluminum, copper or iron or the like. Connections between the external connecting electrodes C1 through C16 and the bonding pads 61 are made by means of unillustrated wiring patterns lying over the wiring board 60 and through holes that extend through the wiring board 60 in its thickness direction, etc. The two individually-chipped flash memories 8 are superimposed over the wiring board 60 with being shifted from each other. The singly-chipped interface controller 7 is superimposed over the flash memories 8. The wiring board 60 and the chip, and the chip and chip are bonded to one another by die bond materials 62. Electrode pads 64 are disposed over the three superimposed chips along the same directional sides in an overlapping state. The corresponding bonding pads 61 of the wiring board are wire-bonded to the disposed electrode pads 64 by bonding wires 65. Since the bonding electrode pads 64 of the superimposed three chips are arranged along the same directional sides in the overlapping state, the bonding wires 65 can be shortened and interference of the wires 65 is also lessened. The IC card microcomputer 9 of the single chip is die-bonded onto the wiring board 60 as a single body, and electrode pads of the chip are bonded to their corresponding bonding pads of the circuit board. The chips stacked over the wiring board 60 are sealed with a resin mold. Reference numeral 66 denotes a mold resin area.

Figure 19:
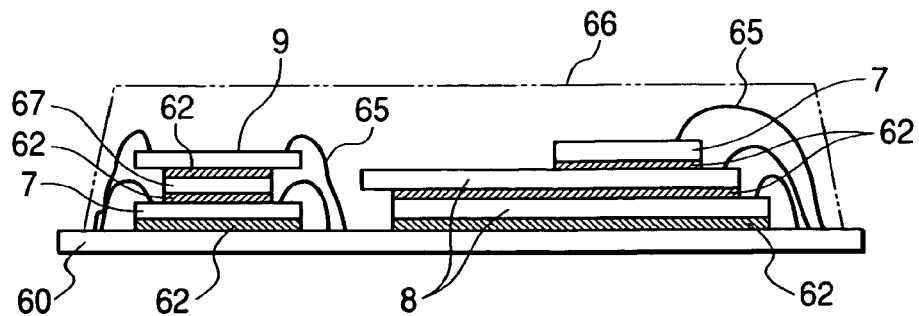
FIG. 19 is a vertical cross-sectional view showing a structure wherein the IC card microcomputer is two-chip stacked in the stacked package structure shown in FIGS. 17 and 18.

A structure wherein the IC card microcomputer 9 is two-chip stacked in the stacked structure shown in FIGS. 17 and 18, is shown in FIG. 19. When the two chips for the IC card microcomputers 9 are directly superimposed on each other where they are of the same kind and identical in size, the electrodes placed on the chips are hidden. In such a case, a dummy chip 67 for a spacer may be sandwiched therebetween. Of course, the dummy chip 67 is smaller than the CI card microcomputer chip.

Figure 20:
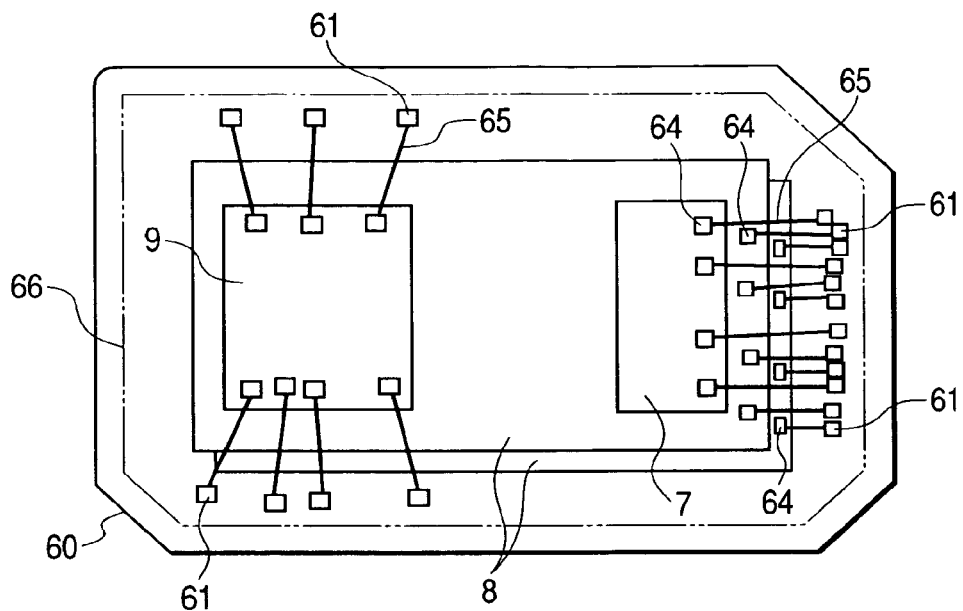
FIG. 20 is a plan view showing a further stacked package structure including the interface controller, flash memories and IC card microcomputer respectively brought to individual semiconductor integrated circuit chips.
Figure 21:
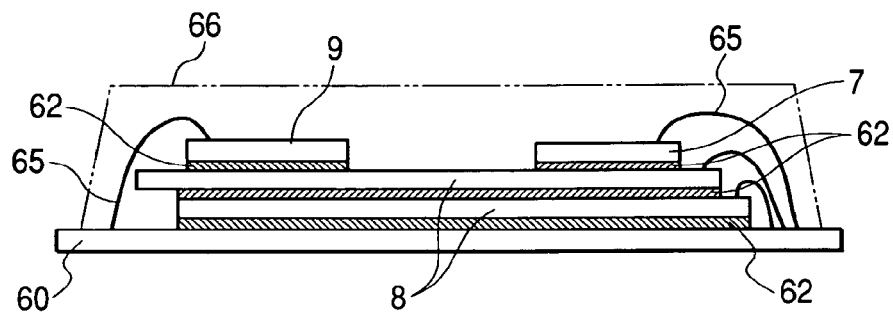
FIG. 21 is a vertical cross-sectional view of the package structure shown in FIG. 20.

A further stacked package structure including the interface controller 7, flash memories 8 and IC card microcomputer 9 respectively brought to individual semiconductor integrated circuit chips is shown in FIG. 20 on a plan basis. A vertical cross-section of the package structure is schematically shown in FIG. 21. The package structure shown in FIGS. 20 and 21 is different from FIGS. 17 through 19 in that the two individually-chipped flash memories 8 are stacked on each other and the individually-chipped interface controller 7 and IC card microcomputer 9 are discretely stacked over the flash memories 8. The present package structure is identical in other configuration to the stacked structure shown in FIGS. 17 and 18. Components each having the same function are respectively identified by the same reference numerals and their detailed description will therefore be omitted.

Figure 22:
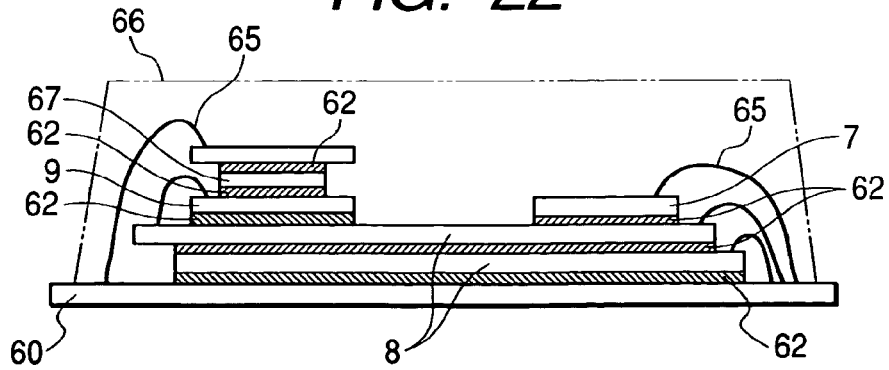
FIG. 22 is a vertical cross-sectional view showing a structure in which the IC card microcomputer is two-chip stacked in the stacked structure shown in FIGS. 20 and 21.

A structure in which the IC card microcomputer 9 is two-chip stacked in the stacked structure shown in FIGS. 20 and 21, is shown in FIG. 22. Since the two chips for IC card microcomputer 9 are of the same kind and identical in size, a dummy chip 67 for a spacer is interposed therebetween without directly superimposing them on each other. The flash memory 8 may take a chip stack of one chip or three or more chips as needed in like manner.

While the invention made above by the present inventors has been described specifically on the basis of the embodiments, the present invention is not limited to them. It is needless to say that various changes can be made thereto within the scope not departing from the gist thereof.

For instance, the present invention can be widely applied not only to the memory card based on the MMC standards but also to a memory card of a multi-functional form based on other standards. Thus, the functions, array and number or the like of the external connecting terminals can be suitably changed. Further, the memory is not limited to the flash memory but may be a memory of other memory form such as a ferromagnetic memory. The security controller is not limited to one which realizes the authenticated function based on the evaluation/authentication body of ISO/IEC15408. It may be a mere microcomputer which performs encryption/decryption.

What is claimed is:

1. A memory card, comprising:
   a controller providing an interface function between the memory card and outside the memory card;
   a nonvolatile memory coupled to the controller;
   a security controller to execute security processing in the memory card and being capable of operating by a non-contact interface signal;
   a clock terminal which inputs an external clock signal to be transferred to the controller;
   a supply voltage terminal which supplies a supply voltage to the memory card, and being spaced from the clock terminal by a first distance;
   a first antenna terminal and a second antenna terminal coupled to the security controller, and each being spaced from the supply voltage terminal by a distance greater than the first distance; and
   a wiring board on which the controller, the nonvolatile memory, the security controller, the clock terminal, the supply voltage terminal, and the first and second antenna terminals are mounted.

2. A memory card according to claim 1, wherein the supply voltage terminal supplies a power supply voltage to the security controller.

3. A memory card according to claim 1, wherein the security controller is coupled to the controller.

4. A memory card according to claim 1, further comprising:
   a data terminal for inputting and outputting data, and coupled to the controller,
   wherein the data terminal and the clock terminal are arranged in a first line on the wiring board; and
   wherein the first and second antenna terminals are arranged in a second line which is different from the first line.

5. A memory card, comprising:
   a controller providing an interface function between the memory card and outside the memory card;
   a nonvolatile memory coupled to the controller;
   a security controller to execute security processing in the memory card and being capable of operating by a non-contact interface signal;
   a clock terminal which inputs an external clock signal to be transferred to the controller;
   a supply voltage terminal which supplies a supply voltage to the memory card, and being spaced from the clock terminal by a first distance;
   a first antenna terminal and a second antenna terminal coupled to the security controller and each being spaced from the supply voltage terminal by a distance greater than the first distance;
   a wiring board on which the controller, the nonvolatile memory, the security controller, the clock terminal, the supply voltage terminal, and the first and second antenna terminals are mounted; and
   a data terminal for inputting and outputting data, and coupled to the controller,
   wherein the data terminal and the clock terminal are arranged in a first line on the wiring board;

wherein the first and second antenna terminals are arranged in a second line which is different from the first line; and wherein the supply voltage terminal is arranged on the wiring board so as to be disposed between the first antenna terminal and the second antenna terminal.

6. A memory card according to claim 5, wherein the supply voltage terminal supplies a power supply voltage to the security controller.

7. A memory card according to claim 5, wherein the security controller is coupled to the controller.

8. A memory card, comprising:

a controller providing an interface function between the memory card and outside of the memory card, the controller including a CPU, a program memory for storing an operating program for the CPU, a flash controller, and an interface portion;

a flash memory coupled to the flash controller;

a security controller to execute security processing in the memory card, coupled to the interface portion and being capable of operating by non-contact interface signal;

a clock terminal which inputs an external clock signal to be transferred to the controller;

a supply voltage terminal which supplies a supply voltage to the memory card, and being spaced from the clock terminal by a first distance;

a first antenna terminal and a second antenna terminal coupled to the security controller, and each being spaced from the supply voltage terminal by a distance greater than the first distance; and a wiring board on which the controller, the nonvolatile memory, the security controller, the clock terminal, the supply voltage terminal, and the first and second antenna terminals are mounted.

9. A memory card according to claim 8, wherein the supply voltage terminal supplies a power supply voltage to the security controller.

10. A memory card according to claim 8, wherein the security controller is coupled to the controller.

11. A memory card according to claim 8, further comprising:

a data terminal for inputting and outputting data, and coupled to the controller, wherein the data terminal and the clock terminal are arranged in a first line on the wiring board; and wherein the first and second antenna terminals are arranged in a second line which is different from the first line.

12. A memory card according to claim 11, wherein the supply voltage terminal is arranged on the wiring board so as to be disposed between the first antenna terminal and the second antenna terminal.

* * * * *